(12) United States Patent  
Hashimoto

(10) Patent No.: US 6,455,982 B1  
(45) Date of Patent: Sep. 24, 2002

(54) OBJECT LEVITATING APPARATUS, AN OBJECT TRANSPORTING APPARATUS EQUIPPED WITH SAID APPARATUS, AND AN OBJECT LEVITATING PROCESS

(75) Inventor: Yoshiki Hashimoto, Tokyo (JP)

(73) Assignee: Kaijo Corporation, Tokyo (JP)

( * ) Notice: Subject to any disclaimer, the term of this patent is extended or adjusted under 35 U.S.C. 154(b) by 1387 days.

(21) Appl. No.: 08/796,478

(22) Filed: Feb. 10, 1997

Related U.S. Application Data

(63) Continuation of application No. 08/335,391, filed on Nov. 3, 1994, now abandoned.

(30) Foreign Application Priority Data

Dec. 24, 1993 (JP) ............................................. 5-347817

(51) Int. Cl.$^7$ ............................................. H01L 41/08
(52) U.S. Cl. ............................................. 310/328
(58) Field of Search ................. 73/570.5; 310/328, 310/334

(56) References Cited

U.S. PATENT DOCUMENTS

| | | | | |
|---|---|---|---|---|
| 3,778,758 A | * | 12/1973 | Carson | 310/325 |
| 4,218,921 A | * | 8/1980 | Oran et al. | 73/505 |
| 4,284,403 A | * | 8/1981 | Rey | 432/1 |
| 4,333,796 A | * | 6/1982 | Flynn | 376/100 |
| 4,393,708 A | * | 7/1983 | Barmatz et al. | 73/505 |
| 4,447,251 A | * | 5/1984 | Dunn et al. | |
| 4,463,606 A | * | 8/1984 | Barmatz | 73/505 |
| 4,520,656 A | * | 6/1985 | Barmatz et al. | 73/505 |
| 4,549,435 A | * | 10/1985 | Barmatz et al. | 73/505 |
| 4,735,096 A | * | 4/1988 | Dorr | 310/325 |
| 4,753,579 A | * | 6/1988 | Murphy | 417/322 |
| 4,757,227 A | * | 7/1988 | Danley et al. | 310/323 |
| 4,773,266 A | * | 9/1988 | Barmatz et al. | 73/505 |
| 4,777,823 A | * | 10/1988 | Barmatz et al. | 73/505 |
| 4,841,495 A | * | 6/1989 | Danley et al. | 367/191 |
| 4,948,497 A | * | 8/1990 | Ohkawa | 209/1 |
| 4,962,330 A | * | 10/1990 | Lierke et al. | 310/323 |
| 5,036,944 A | * | 8/1991 | Danley et al. | 181/0.5 |
| 5,096,017 A | * | 3/1992 | Rey et al. | 181/0.5 |
| 5,215,688 A | * | 6/1993 | Williamson et al. | 264/12 |
| 5,257,676 A | * | 11/1993 | Merkley et al. | 181/0.5 |
| 5,319,670 A | * | 6/1994 | Fox | 373/138 |

OTHER PUBLICATIONS

"Lecture Collection of the Japan Acoustics Society", pp. 745 and 746, published Oct. 3, 1993.

"Electrostatic and Acoustic Instrumentation for Material Science Processing in Space" by P. Clancy et al. Acta Astronautica vol. 7 pp. 877–891, Jul. 1980.*

* cited by examiner

Primary Examiner—Thomas M. Dougherty
(74) Attorney, Agent, or Firm—Sughrue Mion, PLLC

(57) ABSTRACT

An object levitating apparatus, an object transporting apparatus, and an object levitating process are described which, simultaneous to not placing restrictions on the material and so forth of the objects handled, are able to handle objects having relatively large weights and dimensions, while also being compact in size, inexpensive, preferable in terms of safety and so forth, and easy to control.

The above effects are obtained by exciting a vibrator and levitating or transporting an object above the surface of the vibrator by the radiation pressure of the sound waves of the vibrator, and in particular, since there are no vibration nodes present as a result of in-phase piston mode vibration, the dimensions of the object to be levitated and transported can be small.

12 Claims, 29 Drawing Sheets

Testpiece Size and Levitation State

| Dimensions of Bakelite plate | Mass (g) Mass per unit surface area: Constant at 0.28 (g/cm²) | Levitation State |
|---|---|---|
| 0.21 λ (10×10 × 2mm thick) | 0.28 | Unstable and in contact |
| 0.43 λ (20×20 × 2mm thick) | 1.1 | |
| 0.65 λ (30×30 × 2mm thick) | 2.6 | Unstable |
| 0.87 λ (40×40 × 2mm thick) | 4.5 | |
| 1.09 λ (50×50 × 2mm thick) | 7.1 | Somewhat unstable |
| 1.30 λ (60×60 × 2mm thick) | 10.2 | Stable |
| 1.52 λ (70×70 × 2mm thick) | 13.9 | |
| 1.74 λ (80×80 × 2mm thick) | 18.1 | |

Testpiece (grating mode, slit mode)

| No. | Mass(g) | Mass per unit surface area(g/cm$^2$) | Shape |
|---|---|---|---|
| 81 | 26.7 | 0.153 | 6-inch silicon wafer φ150mm |
| 82a | 7.6 | 0.131 | 90(mm); Bakelite plate 65(mm); Thickness 1.0 - 15.2 mm |
| 82b | 11.8 | 0.203 | |
| 82c | 23.7 | 0.407 | |
| 82d | 50.7 | 0.870 | |
| 82e | 79.3 | 1.360 | |
| 82f | 115.6 | 1.980 | |
| 83 | 343.6 | 4.95 | Aluminum metal block φ95mm |
| 84 | 900 | 5.92 | Aluminum metal block φ140mm |
| 85 | 1790 | 11.8 | Aluminum metal block φ140mm |

Fig.30

Testpiece (in-phase piston mode)

| No. | Dimensions (mm) 30×30×Thickness | Mass (g) | Mass per unit surface area (g/cm²) | Shape |
|---|---|---|---|---|
| 87a | 30×30× 0.5 | 0.6 | 0.067 | Bakelite plate |
| 87b | 30×30× 1.0 | 1.2 | 0.133 | |
| 87c | 30×30× 1.5 | 1.9 | 0.211 | |
| 87d | 30×30× 2.0 | 2.5 | 0.278 | |
| 87e | 30×30× 5.0 | 6.5 | 0.722 | |
| 87f | 30×30× 8.0 | 10.2 | 1.133 | |
| 87g | 30×30× 10.0 | 12.4 | 1.378 | |
| 87h | 30×30× 15.0 | 18.2 | 2.011 | |
| 87i | 30×30× 20.0 | 24.1 | 2.678 | |
| 87j | 30×30× 30.0 | 38.0 | 4.222 | |

Fig.31

OBJECT LEVITATING APPARATUS, AN OBJECT TRANSPORTING APPARATUS EQUIPPED WITH SAID APPARATUS, AND AN OBJECT LEVITATING PROCESS

This is a Continuation of application Ser. No. 08/335,391 filed Nov. 3, 1994 now abandoned.

BACKGROUND OF THE INVENTION

1. Field of the Invention

The present invention relates to an object levitating apparatus and its process, which levitates an object in the air (the term "levitate" here refers to the action of lifting an object so as to be in a floating state), and an object transporting apparatus equipped with said apparatus.

2. Description of the Prior Art

The following systems are known in the prior art as examples of this type of apparatus.

(1) A system wherein an object is magnetically levitated and transported using an alternating current magnetic field flowing through a coil;

(2) A system wherein an object is levitated and transported using the Meissner effect of superconductivity; and, (3) A system wherein an object is levitated and transported using pressurized air such as compressed air.

In the apparatuses described in (1) and (2) above, together with the object to be levitated and transported being limited to a ferromagnetic substance or semiconductor, these apparatuses also have the disadvantage of being unable to be applied to objects for which the placing under conditions of being subjected to magnetism is undesirable. In addition, with respect to the apparatus above which uses the Meissner effect of superconductivity, since an expensive coolant is required to cool a coil to an extremely low temperature, together with this leading to increased costs with respect to the consumption of this coolant, considerations also must be taken with respect to the safety of the coolant. Moreover, this apparatus also has the disadvantage of having to be made extremely large in order to levitate and transport objects for an extended period of time in a stable state.

On the other hand, in the apparatus described in (3) above, since a pressurized gas is required to be supplied to the entire surface of the object transport path, together with having to provide an elaborate pressurized gas supply device which thereby makes it difficult to reduce the size of the entire apparatus, this apparatus also suffers the disadvantage of encountering difficulty in controlling the pressure of the supplied gas so that it remains uniform over a wide range. In addition, in the case of using said apparatus under conditions in which the atmosphere must be kept clean, such as in a so-called "clean room", a device is required for suctioning and recovering any gas that escapes from the above-mentioned pressurized gas supply device to prevent diffusion of said escaped gas. In addition to this being an additional obstacle to reducing the size of the apparatus, this apparatus also has the disadvantage of it being difficult to completely recover the gas.

However, an apparatus like that shown in FIG. 1 has recently been developed. Furthermore, this apparatus is disclosed on pages 745 and 746 of the "Lecture Collection of the Japan Acoustics Society" published on Oct. 3, 1983.

Namely, in FIG. 1, a standing wave (not shown) is produced between stepped circular diaphragm 2, vibrated by vibrating device 1, and correspondingly arranged reflecting plate 3, and a plurality of Styrofoam spheres 4 (weight: 1.2 mg, diameter: 4 mm) are levitated by a sound field. Furthermore, in FIG. 1, the direction of gravitational force is shown with arrow g. In this case, it has been verified that each of the spheres 4 is stationary in the air at an interval of ½ the wavelength of the ultrasonic waves, and their positions are at the valleys of sound pressure. In addition, the size of spheres able to levitated is no more than ½ the wavelength, and their weight is considered to be related to sound pressure.

However, in this type of apparatus of a constitution which uses a standing wave to make an object become stationary in the air at the locations of its nodes, the sphere 4 used for the testpiece is currently limited to that which is extremely lightweight, and the vibration amplitude of diaphragm 2 must be made extremely large in order to levitate heavier and larger objects. Thus, in consideration of the stress-related destruction of diaphragm 2 and horn 1a (see FIG. 1), it would be difficult for this apparatus to stably levitate a heavy object for an extended period of time, thus making practical application of this apparatus far from attainable. In addition, although the use of a process in this constitution whereby sound waves are converged into powerful sound waves to allow levitation of relatively heavy objects can be considered, since sound waves would act on a small surface area in comparison with the diameter of diaphragm 2, the result would still be that the apparatus would still only be applicable to small objects.

SUMMARY OF THE INVENTION

In consideration of the above-mentioned disadvantages of the prior art, the object of the present invention is to provide an object levitating apparatus, an object transporting apparatus equipped with said object levitating apparatus as well as an object levitating process and object transporting process, which together with not placing restrictions on the material and so forth of the objects handled, is able to handle objects having relatively large weights and dimensions, while also being compact in size, inexpensive, preferable in terms of safety and so forth, and easy to control.

The present invention composes an object levitating apparatus, equipped with a vibrator and an ultrasonic excitation device that excites said vibrator, which levitates an object above the surface of said vibrator by the radiation pressure of sound waves of said vibrator; wherein, said entire vibrator vibrates longitudinally roughly perpendicular to said surface.

In addition, the present invention composes an object levitating apparatus, equipped with a vibrator and an ultrasonic excitation device that excites said vibrator, which levitates and causes an object to travel above the surface of said vibrator by the radiation pressure of sound waves of said vibrator; wherein, said entire vibrator vibrates longitudinally roughly perpendicular to said surface.

In addition, the object levitating process according to the present invention produces longitudinal vibrations in a vibrator that are roughly perpendicular to its surface, and levitates an object above said surface by the radiation pressure of sound waves of said vibrator.

Moreover, the present invention composes an object levitating apparatus, equipped with a vibrator and an ultrasonic excitation device that excites said vibrator, which levitates an object above the surface of said vibrator by the radiation pressure of sound waves of said vibrator; wherein, said ultrasonic excitation device excites said vibrator so as to vibrate in a slit vibration mode.

In addition, the present invention composes an object levitating apparatus, equipped with a vibrator and ultrasonic excitation device that excites said vibrator, which levitates and causes an object to travel above the surface of said vibrator by the radiation pressure of sound waves of said vibrator; wherein, said ultrasonic excitation device excites said vibrator so as to vibrate in a slit vibration mode.

In addition, the object levitating process according to the present invention produces slit mode vibrations in a vibrator, and levitates an object above said surface by the radiation pressure of sound waves of said vibrator.

BRIEF DESCRIPTION OF THE DRAWINGS

FIG. 18 is a drawing showing the form of each type of testpiece to be used in a levitation experiment relating to the object levitating apparatus as claimed in the present invention.

FIG. 30 is a drawing showing the form of a testpiece used in measurement by the measuring apparatus shown in FIG. 29.

FIG. 31 is a drawing showing the form of a testpiece used in measurement by the measuring apparatus shown in FIG. 29.

DESCRIPTION OF THE PREFERRED EMBODIMENTS

The following provides an explanation of the preferred embodiments of the present invention.

Figure 1:
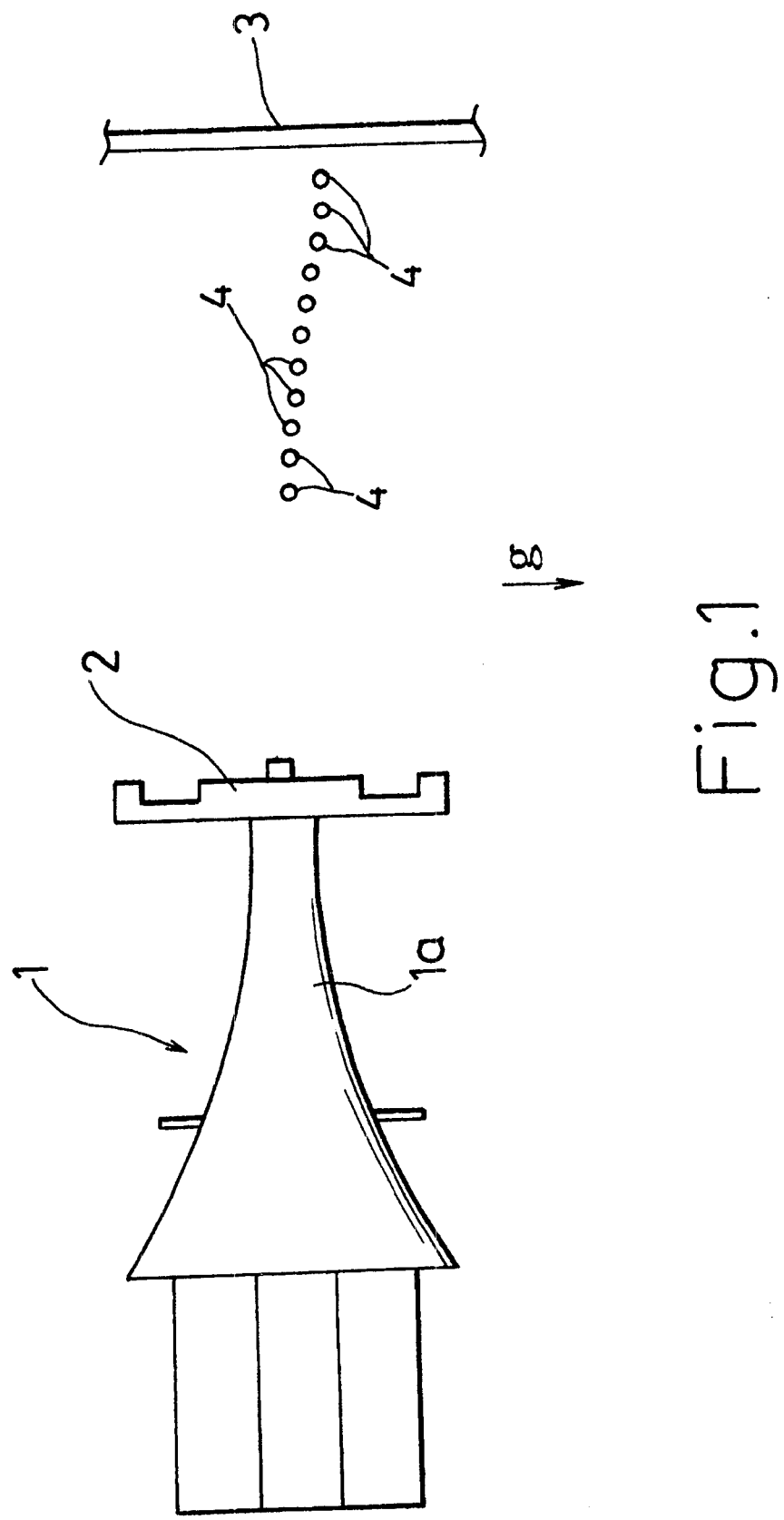
FIG. 1 is a front view showing the gist of the object levitating apparatus of the prior art.
Figure 2:
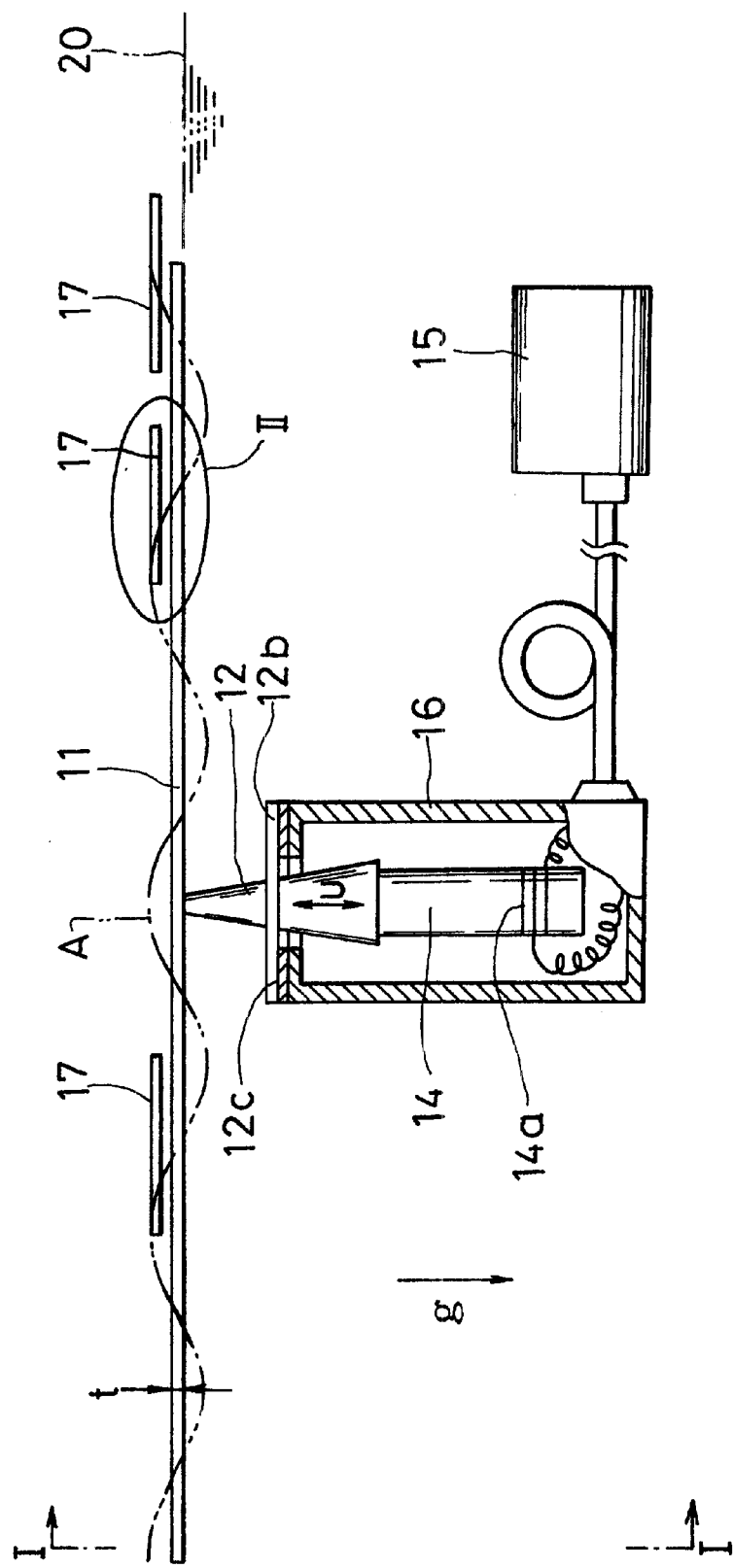
FIG. 2 is a front view, including a partial cross-section, of the essential portion of an object transporting apparatus as a first embodiment of the present invention.
Figure 3:
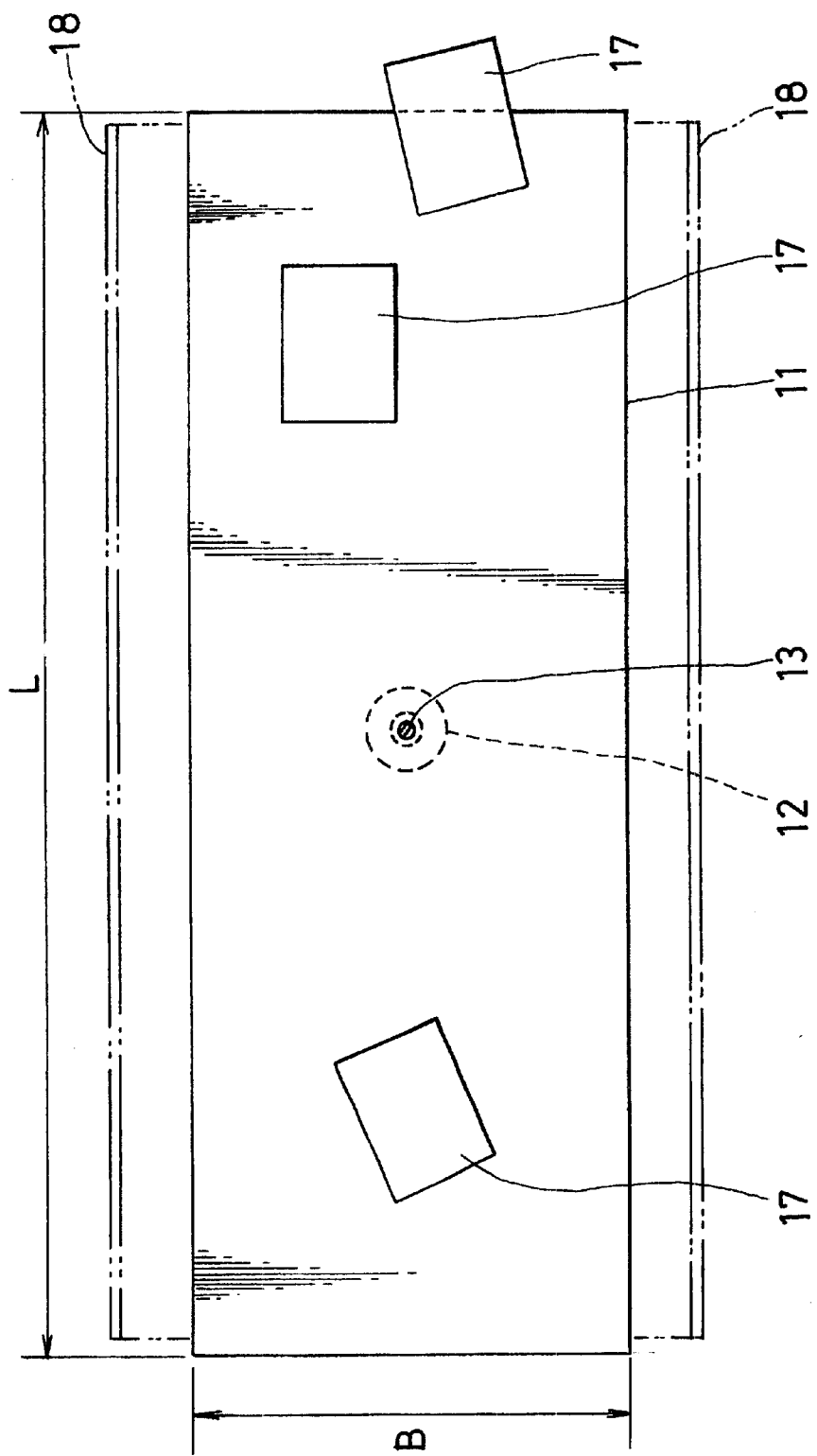
FIG. 3 is an overhead view of the essential portion of the object transporting apparatus shown in FIG. 2.
Figure 4:
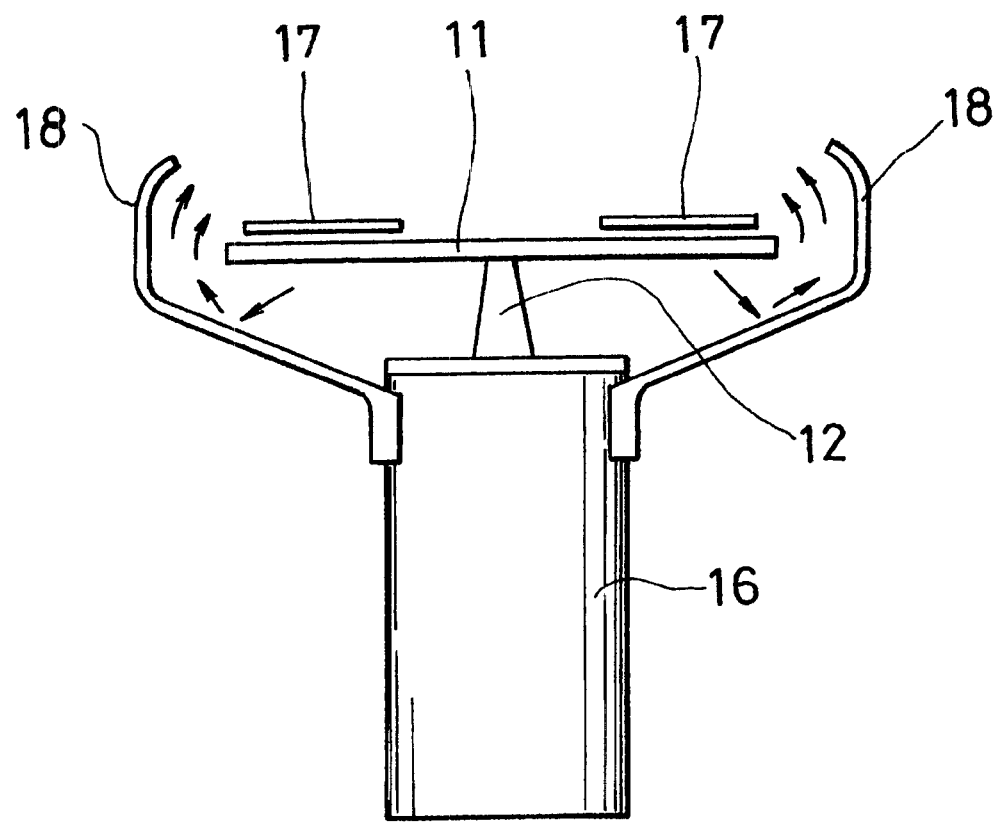
FIG. 4 is a view taken along arrows I—I relating to FIG. 2.

FIGS. 2 through 4 show an object transporting apparatus as a first embodiment of the present invention.

As shown in the drawings, said object transporting apparatus has vibrator 11 formed into the shape of a rectangular plate. This vibrator 11 is fastened to the end of horn 12 at its central portion by screw 13 (shown in FIG. 3). However, the shape of vibrator 11 is not limited to a flat plate, but can be suitably changed according to the application and so forth. In addition, various other means may be used for attaching vibrator 11 to horn 12, such as soldering or welding, and the attachment position can be changed. Furthermore, in FIG. 2, the vibrating direction of ultrasonic vibrations from horn 12 is shown with arrow U. Thus, horn 12 performs longitudinal vibration. The length L (see FIG. 3) and breadth B of vibrator 1 is stipulated by the resonance length of flexural oscillation based on the vibrations propagating from horn 12, and flexural oscillation is taken to be that in the manner of deflection curve A shown in FIG. 2.

Incidentally, vibrator 11 of the present embodiment has a length L of 434 mm, breadth B of 154 mm and thickness t (shown in FIG. 2) of 3 mm. Duralumin is used for the material. In addition, horn 12 is excited at a frequency of roughly 19.4 Khz, and vibrations are applied to the end having an amplitude of roughly 32 $\mu$m p-p. As a result of using these settings, the nodes of the vibrations of vibrator 1 appear at an interval of roughly 54.25 mm in its lengthwise direction, and at an interval of roughly 19.25 mm in the direction of its breadth, resulting in a grating-shaped vibration mode. Furthermore, each of the dimensions, resonance frequency, its amplitude and form of vibration mode of vibrator 1 can be set appropriately. For example, length L can be set to 1000 mm or more.

As shown in FIG. 2, horn 12 is coupled to oscillator 14 on the opposite side on which it is coupled to vibrator 11. Electrode 14a of this oscillator 14 is connected to generator 15, and oscillator 14 generates ultrasonic vibrations as a result of being excited by said generator 15. Horn 12 mechanically amplifies the vibrations generated by this oscillator 14. Furthermore, flange 12b is formed on horn 12, and said flange 12b is fastened to case 16 housing oscillator 14 and said horn 12 with packing 12c in between.

The above-mentioned horn 12, oscillator 14, generator 15 and their related peripheral members are generically referred to as an ultrasonic excitation device.

As shown in FIGS. 3 and 4, plate-shaped sound wave reflecting members 18 are arranged along both sides of the transport path of object 17 to be transported, and are attached to case 16.

Next, the following provides an explanation of the action of an object transporting apparatus having the constitution described above.

To begin with, an explanation is provided regarding the action of an object levitating apparatus contained by said object transporting apparatus.

To begin with, as shown in FIG. 2, the position of the apparatus is adjusted so that vibrator 11 is parallel to a hypothetical horizontal surface 20 during operation of the apparatus. While in this state, power is supplied, oscillator 14 is excited by generator 15, horn 12 vibrates longitudinally and vibrator 11 is excited through said horn 12 to perform flexural oscillation. Sound waves (not shown) are radiated from vibrator 11 due to the performing of flexural oscillation by said vibrator 11.

After vibrator 11 has begun vibrating in the manner described above, object 17 is placed on vibrator 11 and released gently. However, object 17 may also be placed on vibrator 11 in advance before beginning vibration of vibrator 11.

Figure 5:
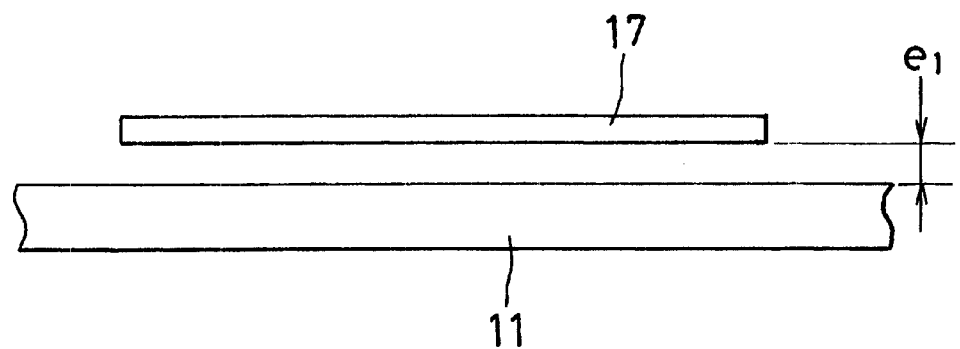
FIG. 5 is an enlarged view of section II in FIG. 2.

FIG. 5 is an enlarged view of section II in FIG. 2. As is clear from said drawing, object 17 is levitated at a distance $e_1$ from the surface of vibrator 11 due to the radiation pressure of sound waves emitted from said vibrator 11. Here, levitation distance $e_1$ refers to the distance based on the surface of vibrator 11 being 0 (zero) in the stationary state while still not emitting sound waves. In addition, although vibrator 11 does not demonstrate flexural oscillation if the surface area of vibrator 11 is small, but rather vibrates in the same vibration mode as the longitudinal vibration applied by horn 12, in this case as well, object 17 is levitated in the same manner. Furthermore, if the supply of power to the ultrasonic excitation device is interrupted, sound waves from vibrator 11 stop immediately and object 17 makes contact with vibrator 11.

Figure 6:
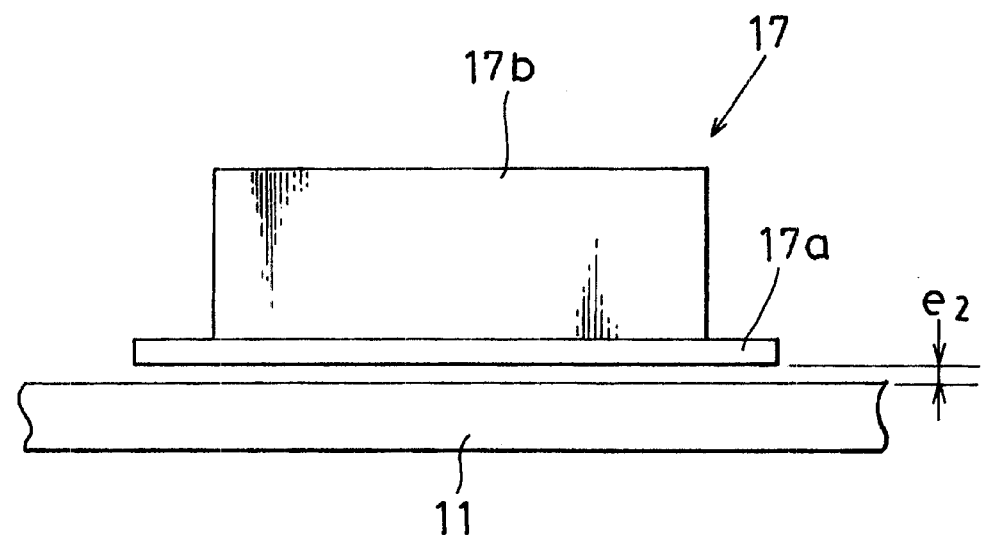
FIG. 6 is a drawing showing another constitution of an object to be transported by the object transporting apparatus shown in FIGS. 2 through 4.

Object 17 shown in FIGS. 2 through 5 is simply a plate-shaped object having relatively light weight. Hypothetical examples of said object 17 include a business card or thin plate and so forth made of plastic or metal. Although these objects were attempted to be levitated serving as testpieces after fabrication of the prototype of the apparatus shown in the present embodiment, experiments were also conducted on an object 17 having a form like that shown in FIG. 6. Namely, this object is composed of plate-shaped carrier 17a and heavy object 17b placed on said carrier 17a. FIG. 6 shows the distance between carrier 17a and vibrator 11 in this case as $e_2$. Furthermore, examples of heavy object 17a that requires this type of carrier 17a include objects that cannot be levitated independently, such as nearly spherical objects or those having an irregular shape, as well as powders or liquids and so forth contained in a container. However, since said heavy object 17b ought to be able to be levitated by itself by removing carrier 17a provided its bottom surface is flat, in addition to conducting levitation experiments using this type of heavy object 17b alone, experiments were also conducted on various other objects. These experiments as well as the various data and so forth obtained from said experiments will be described later.

As a result of the above-mentioned experiments, it was verified that there are no restrictions whatsoever on the material of the testpiece used for levitation, and any type of object is levitated. In addition, although experiments were conducted on objects have a wide range of weights, while light objects were naturally levitated, the heaviest object levitated during these experiments was a metal object weighing roughly 3.26 Kg and having a diameter of roughly 140 mm. The maximum levitation force applied to the object by the radiation pressure of sound waves from vibrator 11 calculated from these results was determined to be 21.4 g/cm². Accordingly, when this value is converted according to the surface area of vibrator 11, if the object were tentatively assumed to extend over the entire surface of vibrator 11, it would be possible to levitate such an object up to a weight of 14.3 Kg. However, although the input electrical power supplied to the vibration system of the apparatus during levitation of relatively lightweight objects was only required to be 130 W, 160 W was required in the case of levitating heavy objects such as that described above.

In addition, as described above, although objects of various materials were used in these levitation experiments, it was determined that the greater the degree of flatness of the bottom surface in opposition to the surface of vibrator 11, the easier it is to levitate heavy objects. However, it was also confirmed that the degree of flatness of the surface of vibrator 11 along with the stability of the overall apparatus are also important.

As is clear from the above, the apparatus as claimed in the present invention is able to levitate all types of objects, regardless of whether or not they are magnetic, without any restrictions on the material and so forth of the object used, and including objects that cannot be placed in a magnetic field. Said apparatus is also able to transport objects in the manner to be described later. In addition, said apparatus is also able to levitate and transport objects having relatively large weight and dimensions.

Continuing, the following provides an explanation of the action of an object transport apparatus containing the object levitating apparatus described above. This object transporting apparatus consists of adding a traveling device, which causes levitated object 17 to travel, to the constitution of the object levitating apparatus described above.

Figure 7:
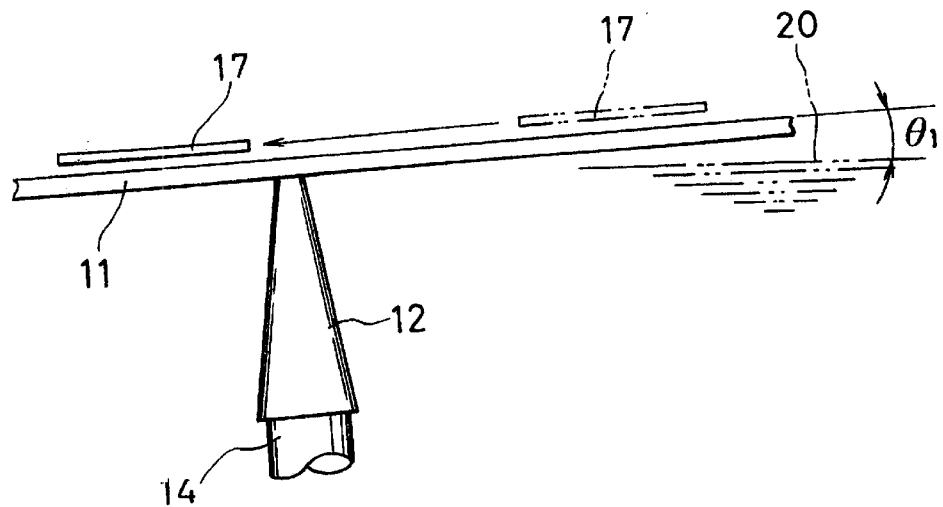
FIG. 7 is a drawing explaining the operation of the object transporting apparatus shown in FIGS. 2 through 4.

The constitution like that shown in FIG. 7 is used as an example of this device for causing travel of object 17. Namely, the surface of vibrator 11 is inclined by an angle $\theta_1$ with respect to hypothetical horizontal plane 20. Acceleration is produced based on gravitational force in object 17 as a result of this angle $\theta_1$ thereby resulting in travel of object 17. However, this angle $\theta_1$ was set to 150 based on the results of experiments. In the case of said constitution, since a driving source for travel of object 17 is not especially required and the apparatus is simply inclined, it is easy to achieve reduced size of the overall apparatus and reduced costs. Furthermore, as described above, if the supply of power to the ultrasonic excitation device is interrupted, object 17 stops immediately and makes contact with vibrator 11 causing it to stop due to frictional resistance.

However, at the time object 17 is transported in the manner described above, deviation from the transport path is prevented by the action described below.

Namely, as shown in FIGS. 3 and 4, sound wave reflecting members 18 are arranged along both sides of said transport path. As is clear from FIG. 4, these sound wave reflecting members 18 do not make contact with vibrator 11, and guide sound waves towards the above-mentioned transport path while reflecting said sound waves radiated from the bottom surface of vibrator 11 as shown with the arrows in the drawing. Since this means that sound waves guided in this manner are present on the sides of the transport path, these sound waves serve as a wall that has the action of pushing back object 17 when it attempts to deviate from the transport path. Accordingly, deviation from the transport path by object 17 does not occur. In addition, according to said constitution, object 17 does not make contact with sound wave reflecting members 18. However, even if these sound wave reflecting members 18 are not provided, it has been confirmed that when object 17 is about to protrude from the edge of vibrator 11, it is pulled back to the inside by the action of sound waves radiating from said vibrator 11 itself.

Next, the following provides an explanation of other object transporting apparatuses each equipped with a traveling device different from the type in which object 17 is caused to travel by utilization of gravitational force as described above. Furthermore, with the exception of those portions described below, since each of these object transporting apparatuses is composed in the same manner as the object transporting apparatus shown as a first embodiment in FIGS. 2 through 4 and 7, an explanation of the entire apparatus will be omitted to avoid repetition. As such, the explanation will only focus on the essential portion. In addition, those constituent members identical to the constituent members of the object transporting apparatus shown in FIGS. 2 through 4 and 7 are indicated using the same reference numerals in the following explanations.

Figure 8:
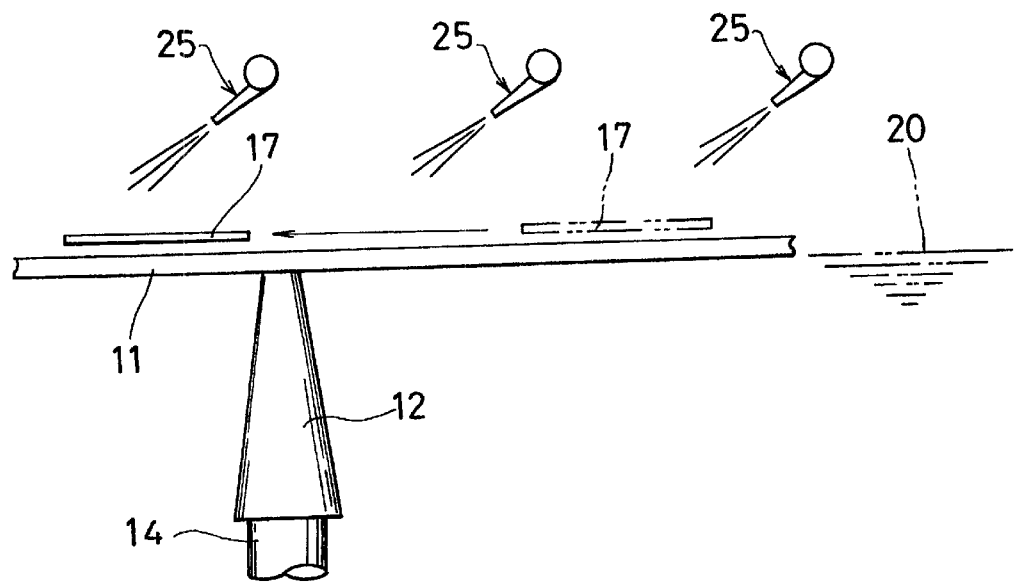
FIG. 8 is a front view of the essential portion of an object transporting apparatus as a second embodiment of the present invention.

FIG. 8 shows the essential portion of an object transporting apparatus as a second embodiment of the present invention.

As shown in the drawing, in said object transporting apparatus, vibrator 11 is parallel to hypothetical horizontal plane 20. The device for travel of object 17 has a plurality of nozzles 25 arranged in a row at mutually prescribed intervals along the direction in which object 17 is to travel. These nozzles 25 are, for example, arranged above vibrator 11 and blow compressed air towards object 17 from behind at an angle. Object 17 is accelerated by this blown compressed air resulting in travel. An air blowing device that acts as the above-mentioned traveling device is composed of these nozzles 25 and a compressor and so forth (not shown) which supplies compressed air to said nozzles 25. Furthermore, the gas that is blown after compression is not limited to air, but various gases can be used, provided environmental effects such as those on the atmosphere are allowed, according to the application.

Figure 9:
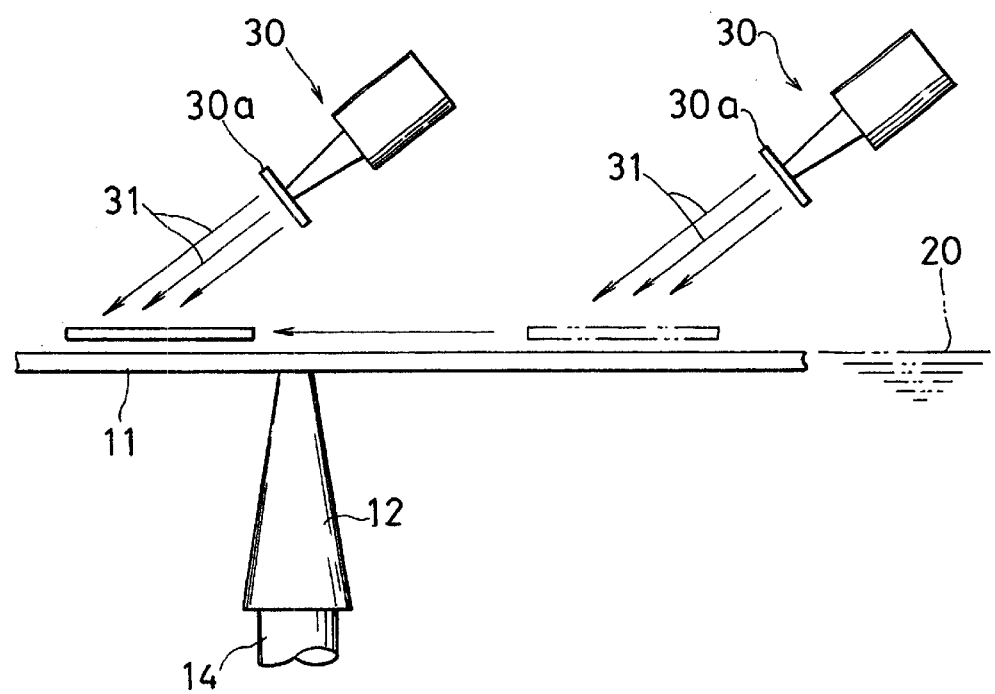
FIG. 9 is a front view of the essential portion of an object transporting apparatus as a third embodiment of the present invention.

FIG. 9 shows the essential portion of an object transporting apparatus as a third embodiment of the present invention. Although travel of object 17 was made to travel by blowing of air in the object transporting apparatus of the above-mentioned second embodiment, in this apparatus, ultrasonic waves are radiated to object 17 causing object 17 to travel as a result of this driving force.

Namely, as shown in the drawing, a plurality of ultrasonic radiators 30 are provided in a row at equal intervals along the direction in which object 17 is to travel. These ultrasonic radiators 30 are provided inclined at an angle so that ultrasonic waves 31 radiated from diaphragm 30a equipped on each are directed downward and at a forward angle.

In said constitution, object 17 is accelerated and transported by the radiation pressure of sound waves emitted from each ultrasonic radiator 30.

Figure 10:
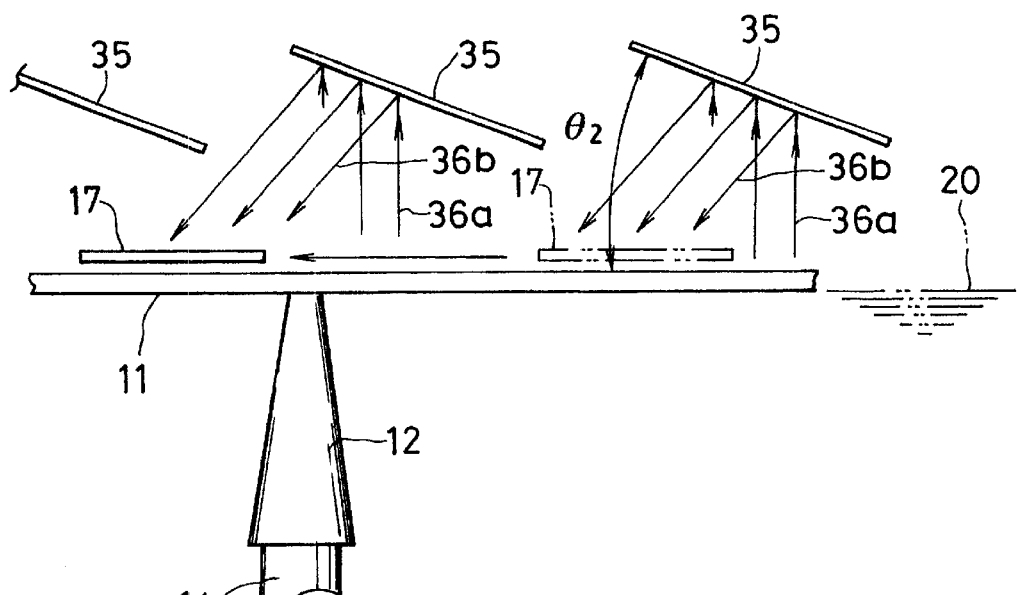
FIG. 10 is a front view of the essential portion of an object transporting apparatus as a fourth embodiment of the present invention.

FIG. 10 shows the essential portion of an object transporting apparatus as a fourth embodiment of the present invention. Although ultrasonic radiators are provided for propelling object 17 in the object transporting apparatus of the third embodiment shown in FIG. 9, in this embodiment, sound waves emitted by vibrator 11 itself act to propel the object.

As shown in the drawing, in the present embodiment, a plurality of plate-shaped reflecting members 35 are provided in a row along the direction in which object 17 is to travel above vibrator 11. Each reflecting member 35 is provided at an angle so as to form an angle of $\theta_2$ with respect to the surface of vibrator 11 and so that the front end is higher. Accordingly, sound waves 36a radiated upward from vibrator 11 are reflected with these reflecting members 35 and proceed downward at a forward angle. Object 17 is then accelerated and transported by these reflected waves 36b.

Furthermore, although a plurality of reflecting members 35 are provided individually in the present embodiment, an alternative constitution may also be employed wherein a single, long reflecting member (not shown) is provided wherein a plurality of inclined portions are formed in a corrugated pattern.

In addition, in the second through fourth embodiments shown in FIGS. 8 through 10, respectively, although a plurality of nozzles 25, ultrasonic radiators 30 and reflecting members 35 are respectively provided in a row along the object transport path, a constitution can also be employed wherein these are moved to as to follow object 17 being transported in the form of a single unit.

Figure 11:
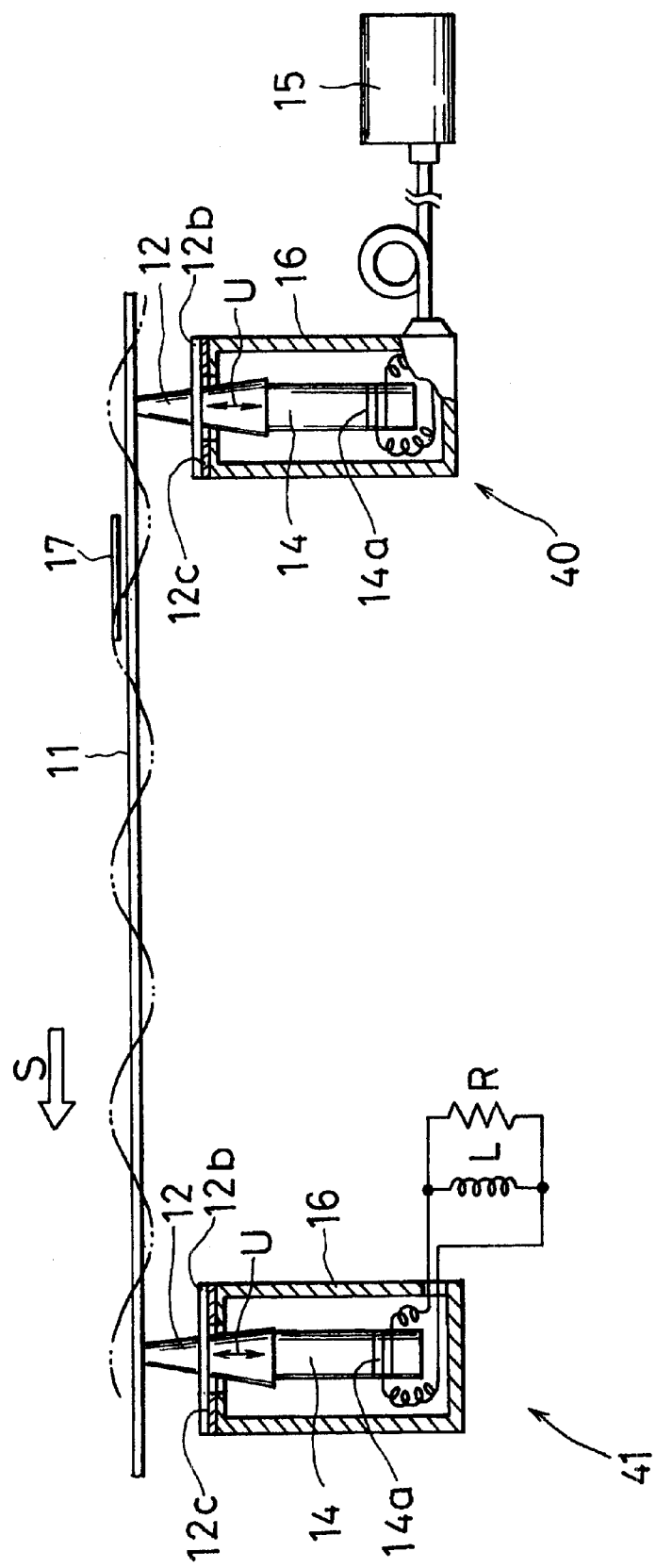
FIG. 11 is a front view, including a partial cross-section, of an object transporting apparatus as a fifth embodiment of the present invention.

FIG. 11 shows an object transporting apparatus as a fifth embodiment of the present invention. In said object transporting apparatus, the traveling means that causes object 17 to travel is composed in the manner described below.

As shown in the drawing, ultrasonic excitation device 40, which excites vibrator 11, is arranged on the right end of said vibrator 11, while energy conversion device 41, having essentially the same constitution as said ultrasonic excitation device 40, is arranged on the left end. This energy conversion device 41 converts the energy of ultrasonic waves emitted by vibrator 11 excited by ultrasonic excitation device 40 back to electrical energy. More specifically, a circuit consisting of resistor R and coil L is connected to electrode 14a of oscillator 14 equipped on said energy conversion device 41. Electrical energy converted from ultrasonic energy in the form of mechanical energy is converted into Joule heat and dispersed as a result of passing through this circuit.

In said constitution, if this energy conversion device 41 is allowed to act simultaneous to the ultrasonic excitation device, the waves of flexural oscillation produced in vibrator 11 become progressive waves as shown with arrow S. Object 17 then travels in the state of riding these progressive waves.

Figure 12:
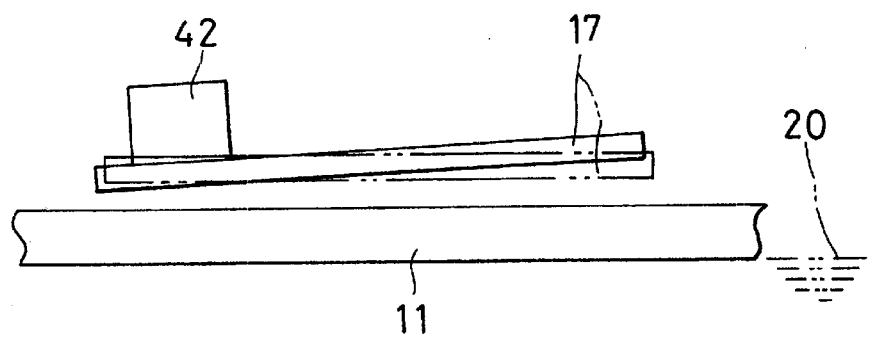
FIG. 12 is a front view of the essential portion of an object transporting apparatus as a sixth embodiment of the present invention.

FIG. 12 shows the essential portion of an object transporting apparatus as a sixth embodiment of the present invention.

As shown in the drawing, in said object transporting apparatus, weight 42 is loaded on the side of the direction of travel of object 17 as a means of travel for object 17. When the weight is loaded in this manner, since the distribution of weight differs between the side in the direction of travel and the side in the opposite direction, object 17 becomes inclined in a levitated state. This being the case, sound waves (not shown) radiated upward from vibrator 11 are reflected with the bottom surface of object 17, and those reflected waves (not shown) proceed downward at a backward angle. Object 17 is then accelerated by the driving force produced by these reflected waves causing it to travel. Furthermore, the distribution of weight may be differed to incline object 17 without using such a weight 42 by, for example, changing the thickness between the side in the direction of travel and the side in the opposite direction of vibrator 17 itself.

Figure 13:
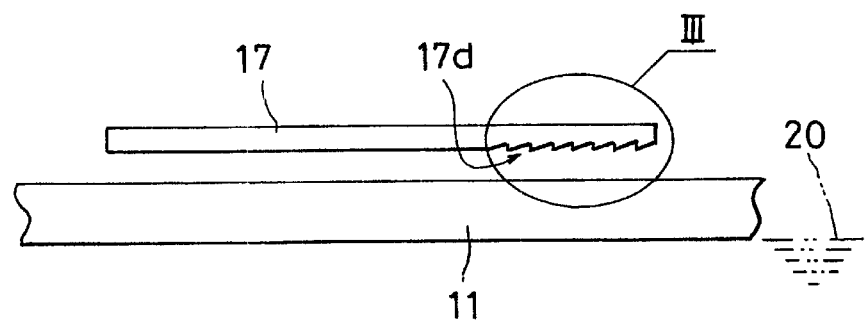
FIG. 13 is a front view of the essential portion of an object transporting apparatus as a seventh embodiment of the present invention.

FIG. 13 shows the essential portion of an object transporting apparatus as a seventh embodiment of the present invention.

Figure 14:
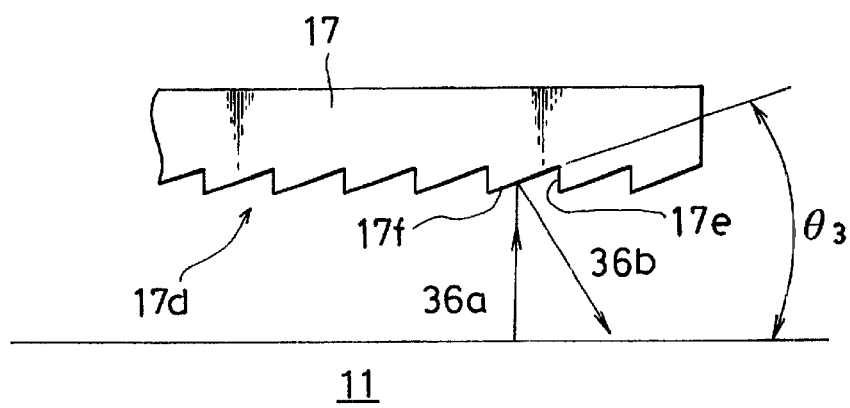
FIG. 14 is an enlarged view of section III in FIG. 13.

As shown in the drawing, in this object transporting apparatus, projections 17d are formed in the bottom surface and to the back of object 17 as a means of travel for object 17. As is clear from FIG. 14, these projections 17d are composed by forming vertical surface 17e and inclined surface 17f mutually and continuously in the direction in which said object 17 is to travel. Said inclined surface 17f is formed to form an angle of $\theta_3$ with respect to the surface of vibrator 11 and so that the front end is lower. Accordingly, sound waves 36a radiated upwards from vibrator 11 are reflected with these inclined surfaces 17f and proceed downward and at a backward angle. Object 17 is then accelerated and transported by the driving force of these reflected sound waves 36b.

However, as is shown in FIGS. 3 and 4, in the object transporting apparatuses of each of the embodiments described above, sound wave reflecting members 18 are provided along the transport path to prevent deviation of object 17 from the transport path. Sound waves emitted from the bottom surface of vibrator 11 and reflected along said sound wave reflecting members 18 act as walls. Although this constitution is able to accommodate objects up to a certain mass, when the mass of object 17 becomes excessively large, since the inertia when said object 17 is about to deviate outside the transport path is also large, it becomes difficult to control this deviation with a wall of sound waves alone. Therefore, the constitution shown in FIG. 15 is added.

Figure 15:
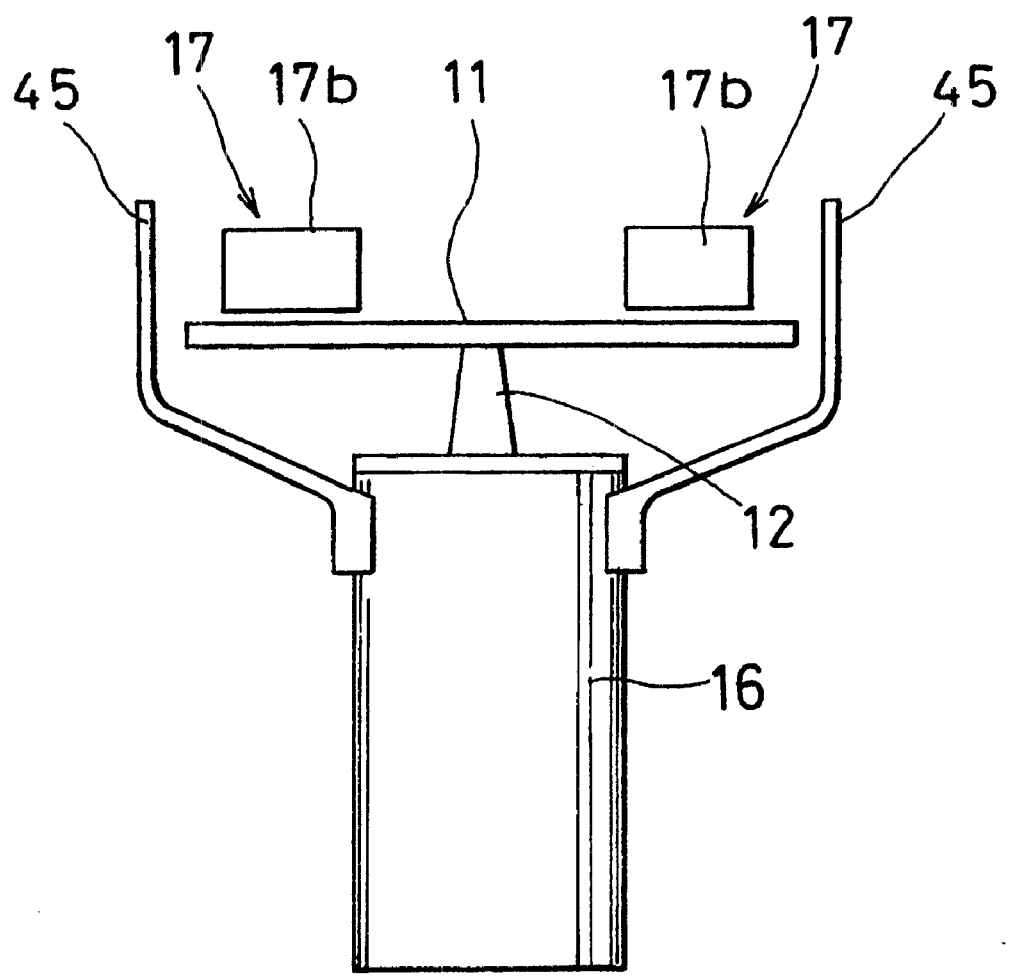
FIG. 15 is a side view relating to the object transporting apparatuses of each of the embodiments shown in FIGS. 2 through 14, showing variations of one portion of those apparatuses.

As shown in FIG. 15, flat plate-shaped deviation prevention members 45 are arranged on both sides of the transport path of objects 17 having a large weight (for example, those composed of heavy objects 17b alone). Accordingly, when objects 17 are about to deviate from the transport path, they make extremely light contact with the inside surfaces of these deviation prevention members 45 to avoid deviation.

Figure 16:
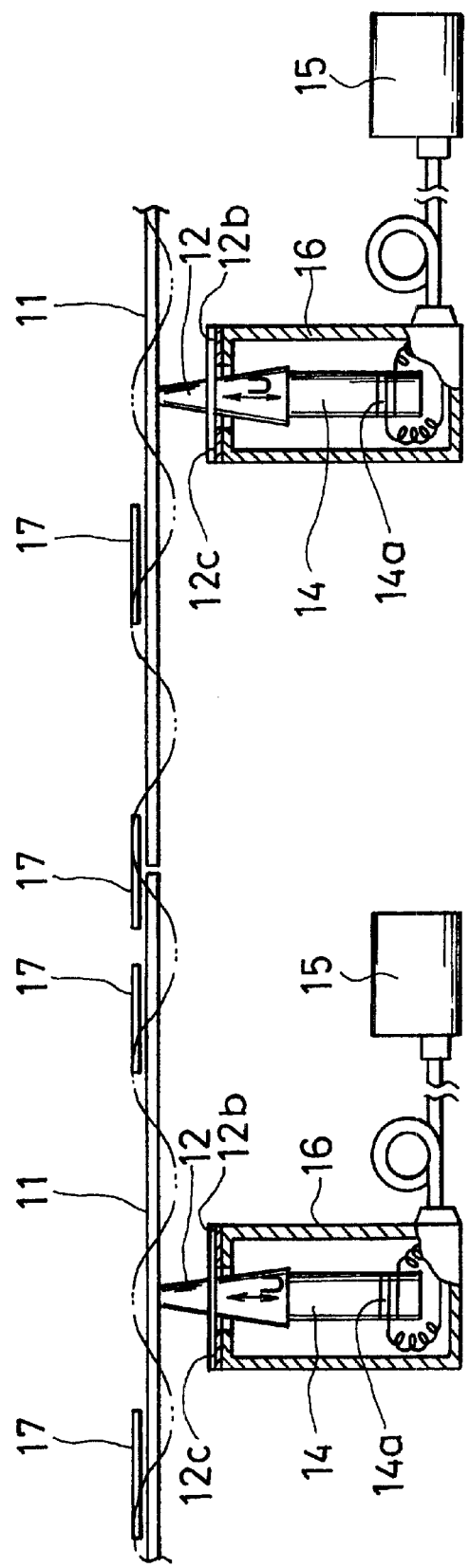
FIG. 16 is a front view, including a partial cross-section, showing a plurality of object transporting apparatuses arranged in a row.

Although each of the previously described embodiments indicated a single object transporting apparatus, as shown in FIG. 16, two or more object transporting apparatuses can be arranged linearly and in a row so that each of their transport paths is continuous. Thus, the length of the transport path can be set as desired resulting in a greater degree of freedom and excellent general applicability.

Figure 17:
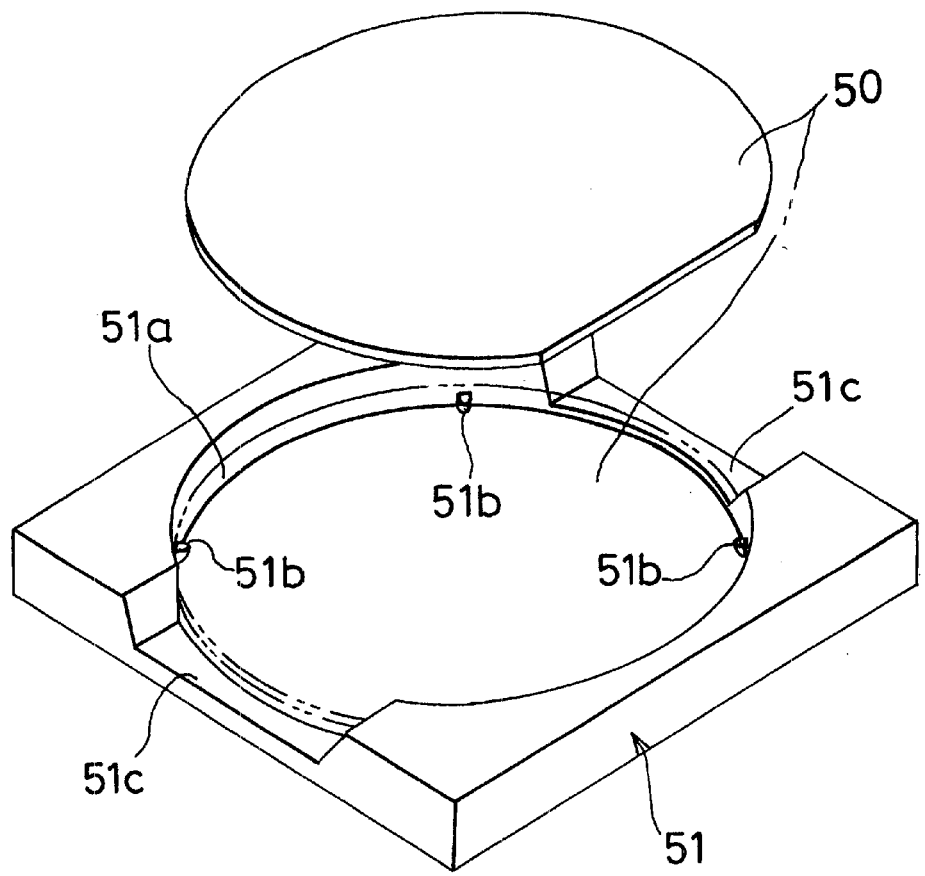
FIG. 17 is a perspective view of a silicon wafer to be transported by the object transporting apparatuses of each of the embodiments shown in FIGS. 2 through 14, and a carrier on which said silicon wafer is loaded.

However, the constitution shown in FIG. 17 was devised as an example of practical application of the transported side that is transported by the object transporting apparatuses of each of the embodiments previously described.

In this constitution, the object to be transported is silicon wafer 50, the primary product during manufacturing of semiconductors (IC chips). Said silicon wafer 50 is loaded on carrier 51, formed into the shape of, for example, a rectangular plate, followed by levitation and transport by the object transporting apparatus described above.

As is clear from this drawing, circular indentation 51a, for insertion of roughly circular silicon wafer 50, is provided in carrier 51. A plurality of, for example four, projections 51b are formed at equal intervals on the inside surface of this indentation 51a, and silicon wafer 50 is loaded on these projections 51b within indentation 51a. Notches 51c, continuous with indentation 51a, are formed on both sides of carrier 51. These notches 51c have a certain depth that results in the formation of a prescribed gap between the bottom surfaces of said notches 51c and the lower surface of silicon wafer 50 when silicon wafer 50 is loaded on said projections 51c. Namely, when a robot hand and so forth not shown inserts or takes out this silicon wafer 50 within indentation 51a, silicon wafer 50 can be grabbed through the above-mentioned notches 51c.

Furthermore, silicon wafer 50 can also be transported directly without using said carrier 51.

The following provides a description of experiments conducted to confirm the levitation state of object 17 according to its size that is used for transport (levitation) with respect to the object transporting apparatuses (including object levitating apparatuses) of each of the embodiments previously described.

Namely, since vibrator 11 is performing flexural oscillation in the case of the lattice mode sound source in each of the embodiments previously described, the radiation pressure of the radiated sound waves differs according to the location above the radiating surface. Consequently, objects smaller than the dimensions of the square shape of the lattice obtained with Chladni's sand figures are not levitated with stability horizontal with the surface of vibrator 11, and end up being levitated slanted on an incline, or one edge of object 17 makes contact with a portion of the vibration nodes. An experimental study was therefore conducted on the wavelength of flexural oscillation and the size of object 17. Furthermore, the testpieces used for levitation as object 17 were fabricated into various dimensions shown in FIG. 18 using Bakelite for the material. In FIG. 18, however, the symbol λ indicates 1 wavelength of flexural oscillation. In addition, in this experiment, a rectangular Duralumin plate having length L of 434 mm, breadth B of 178 mm and thickness t of 3 mm was used for vibrator 11. The driving frequency, namely the excitation frequency of horn 12 (see FIGS. 2 and 3) was 19.11 kHz, and the dimensions of the grating of the grating vibration mode were roughly 32×23 mm. The vibration amplitude at the center of vibrator 11, namely at the head of screw 13 shown in FIG. 3, was measured and found to be constant at 30 μmp-p. The input voltage of the vibration system at that time was 70 W.

The results of measuring the levitation state are shown in the right side of FIG. 18.

Figure 19A:
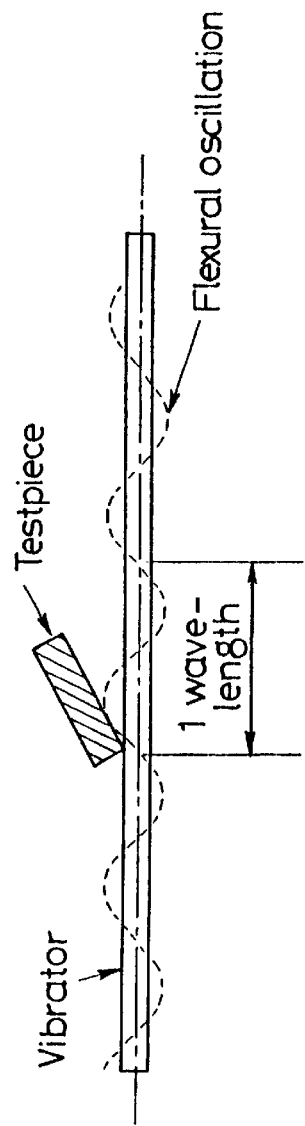
FIGS. 19a and 19b are conceptual drawings showing the levitation state of a testpiece above the object levitating apparatus as claimed in the present invention.
Figure 19B:
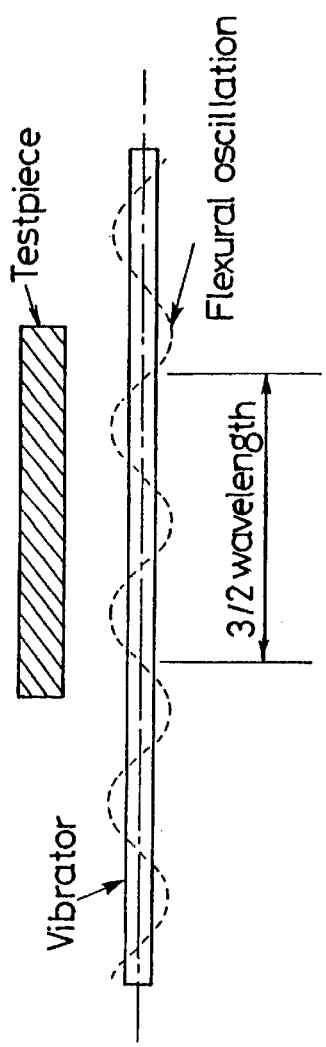

The dimensions of the node of the above-mentioned grating mode, namely roughly 32×23 mm, are the dimensions of the half wavelength. In contrast, the dimensions of the testpiece that is levitated with stability were measured to be at least 60×60 mm (1 mm thick). Based on this finding, it was verified that if the testpiece dimensions are at least roughly ³⁄₂ of the wavelength, it will be levitated with stability horizontal to the vibrator. A conceptual drawing of this is shown in FIG. 19.

Figure 20:
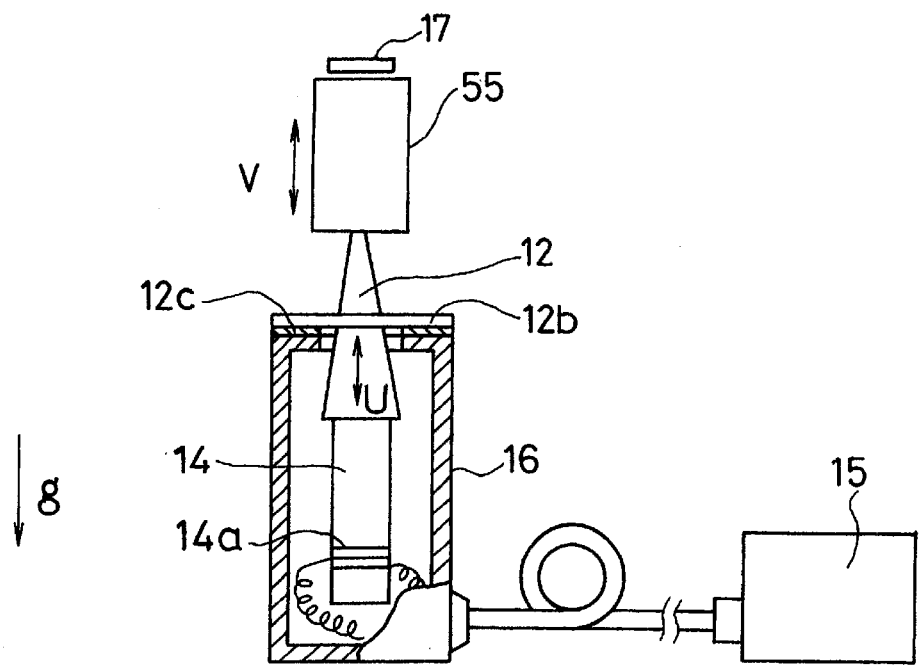
FIG. 20 is a front view, including a partial cross-section, of an object levitating apparatus as an eighth embodiment of the present invention.
Figure 21:
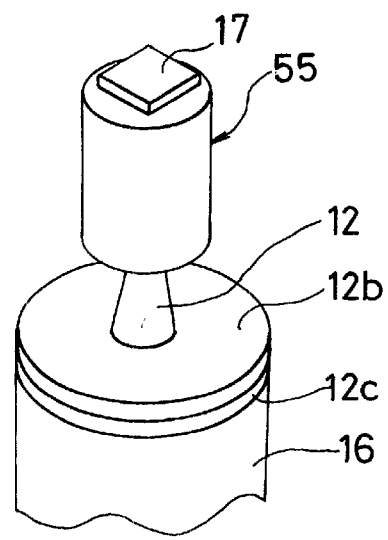
FIG. 21 is a partial cross-sectional view of the object levitating apparatus shown in FIG. 20.

Next, the following provides an explanation of an object levitating apparatus as an eighth embodiment of the present invention based on FIGS. 20 and 21. Furthermore, since said object levitating apparatus is composed similar to the object levitating apparatus contained in the object transporting apparatus as a first embodiment previously described with the exception of those portions described below (shown in FIGS. 2 through 4), an explanation of the entire apparatus will be omitted, and will only focus on the essential portion. In addition, in the following explanation, those constituent members that are the same as the constituent members of the object levitating apparatus shown in FIGS. 2 through 4 are shown using the same reference numerals. In addition, this applies similarly with respect to explanations of other embodiments that follow.

In said object levitating apparatus, a stainless steel straight horn 55 having a diameter of 60 mm and resonance length of 126 mm is used as the vibrator for levitating object 17 above the surface. This straight horn 55 is coupled to the end of horn 12, having an amplitude magnification factor of 2.5, with M14 screws (not shown). As a result of measuring vibration amplitude at several locations, straight horn 55 was confirmed to be vibrating uniformly in phase overall, namely vibrating longitudinally either perpendicular or roughly perpendicular to the surface for levitating object 17. The term "in-phase" indicates that direction of vibration V of straight horn 55 is the same as direction of vibration U of horn 12 coupled to it. Furthermore, since a pattern is not obtained with Chladni's sand figures due to the absence of vibration nodes on the surface, that drawing is omitted. In addition, this type of straight horn 55 is disclosed on pages 1 through 21 of "Design of Solid Horns Used in Ultrasonic Processing" (Journal of the Telecommunications Society) published on Jun. 27, 1955.

According to the above-mentioned constitution, object 17 is levitated above the surface of straight horn 55. Furthermore, as was previously described, in said constitution, since straight horn 55 vibrates in the manner of a piston in-phase with horn 12 for excitation of said straight horn 55, the vibration mode of said straight horn 55 will be generically referred to as the in-phase piston mode.

Figure 22:
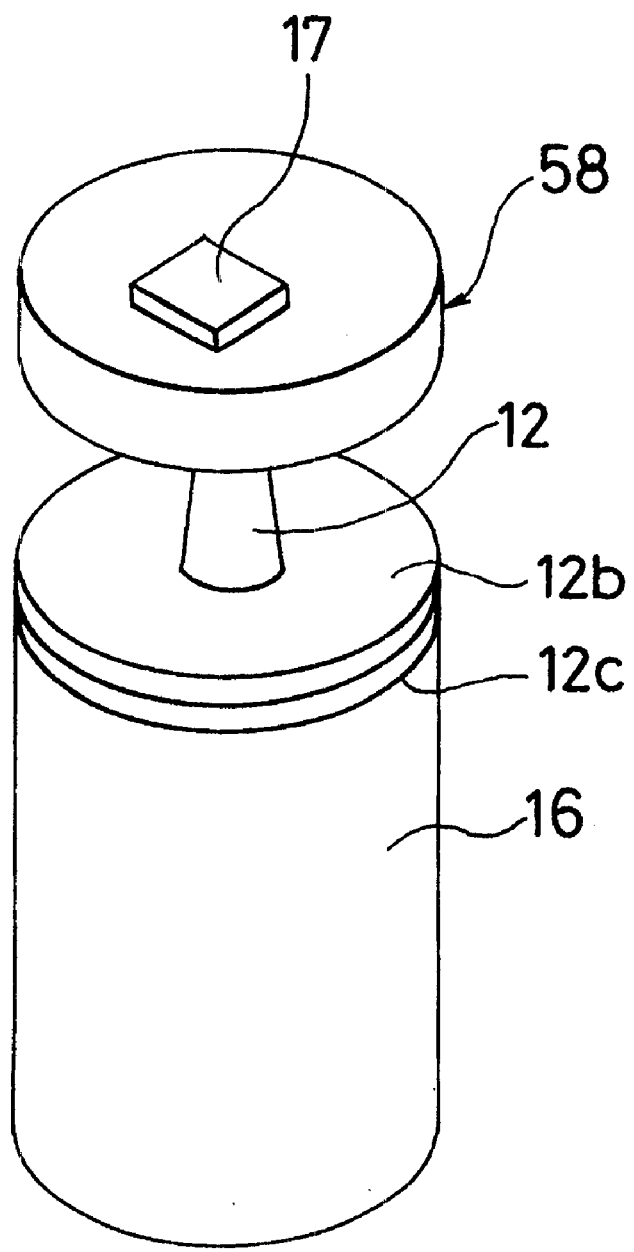
FIG. 22 is a perspective view of the essential portion of an object levitating apparatus as a ninth embodiment of the present invention.

FIG. 22 indicates an object levitating apparatus as a ninth embodiment of the present invention. As shown in the drawing, in this embodiment, relatively thick disc-shaped member 58 is used as the vibrator for levitating object 17 above the surface. Duralumin, for example, can be used for the material of this disc-shaped member 58. In addition, this type of disc-shaped vibrator is disclosed on pages 7 through 12 and other locations of "Thick Disc-Shaped Ultrasonic Radiators" (Journal of the Telecommunications Society US80-63) published on Feb. 23, 1981.

In said constitution as well, the above-mentioned disc-shaped member 58 vibrates longitudinally with horn 12 in the in-phase piston mode, thereby levitating object 17 above the surface of disc-shaped member 58.

Figure 23:
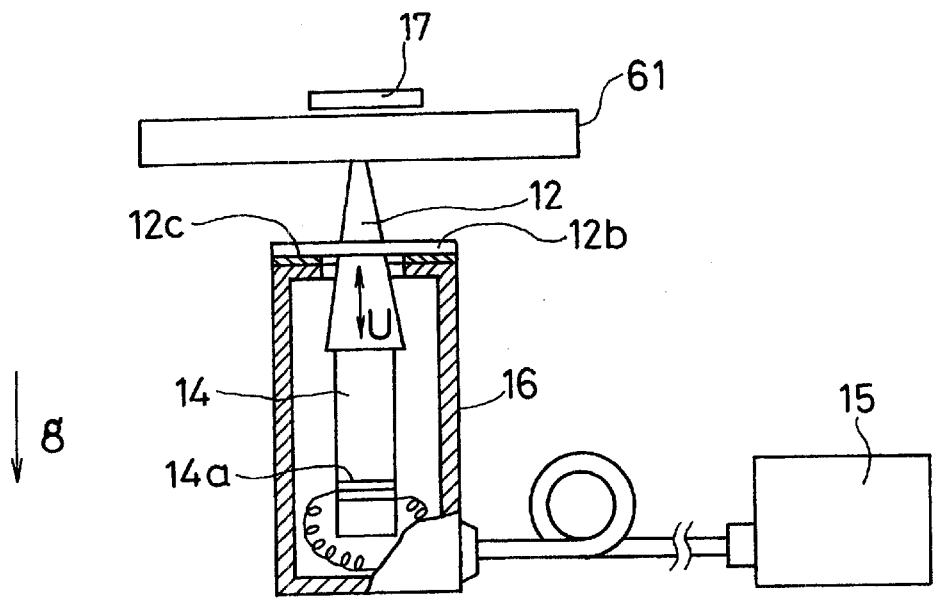
FIG. 23 is a front view, including a partial cross-section, of an object levitating apparatus as a tenth embodiment of the present invention.
Figure 24:
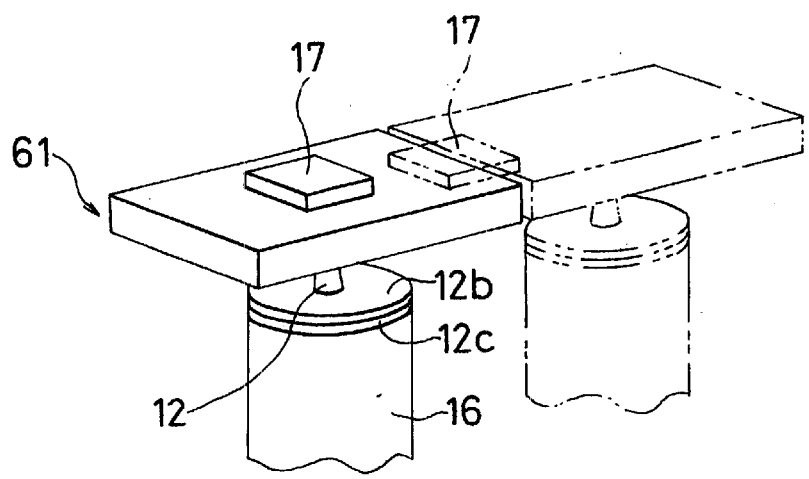
FIG. 24 is a partial cross-sectional view of the object levitating apparatus shown in FIG. 23.

Next, the following provides an explanation of an object levitating apparatus as a tenth embodiment of the present invention with reference to FIGS. 23 and 24. As shown in the drawings, in this embodiment, rectangular plate-shaped member 61, having a thickness similar to the above-mentioned disc-shaped member 58, is used for the vibrator for levitating object 17 above the surface. Duralumin, for example, can be used for the material of this rectangular plate-shaped member 61. In addition, this type of rectangular plate-shaped vibrator is disclosed on pages 13 through 18 and other locations of "Thick Square Plate-Shaped Ultrasonic Radiators" (Journal of the Telecommunications Society US80-64) published on Feb. 23, 1981.

In said constitution as well, the above-mentioned rectangular plate-shaped member 61 vibrates longitudinally overall in the in-phase piston mode with horn 12, thereby levitating object 17 above the surface of rectangular plate-shaped member 61.

In addition, in contrast to the object levitating apparatus of this constitution, by adding a traveling device like those shown in FIGS. 7 through 14, an object transporting apparatus is composed that is able to perform transport of object 17. In the case of performing this transport, as shown in FIG. 24, if two or more object transporting apparatuses are installed in a row so that their respective transport paths are continuous, the length of the transport path can be set as desired, thus resulting in excellent general applicability due to a large degree of freedom.

Figure 25:
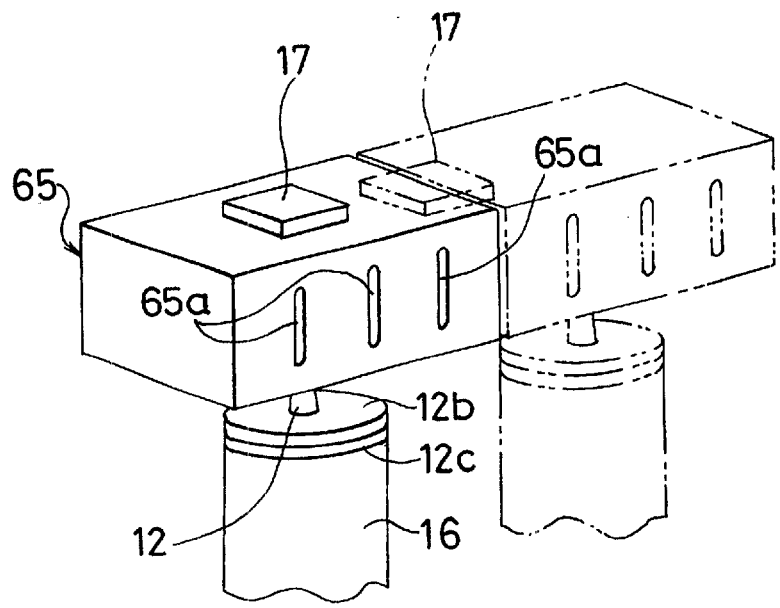
FIG. 25 is a perspective view of the essential portion of an object levitating apparatus as an eleventh embodiment of the present invention.

FIG. 25 indicates an object levitating apparatus as an eleventh embodiment of the present invention. As shown in the drawing, in this embodiment, vibrator 65, which levitates object 17 above its surface, is formed roughly into the shape of a rectangular parallelopiped. This vibrator 65 is formed using aluminum, for example, for the material. This type of vibrator 65 is disclosed on pages 13 through 26 and other locations of "Discussion of Design Techniques for Large Tools for Ultrasonic Plastic Welders" (Journal of the Telecommunications Society US85-64) published on Feb. 24, 1986.

In the object levitating apparatus of this constitution as well, the above-mentioned vibrator 65 vibrates longitudinally overall in the in-phase piston mode with horn 12, thereby levitating object 17 above the surface of vibrator 65. Furthermore, as shown in FIG. 25, a plurality, in the case 3, of slits 65a are formed mutually in parallel in vibrator 65 extending in the direction of its vibration. These slits are for obtaining uniform distribution of displacement on the radiating surface by suppressing vibrations in the horizontal direction due to the effects of Poisson's ratio.

By adding a traveling device as shown in FIGS. 7 through 14 to the object levitating apparatus of the constitution shown in FIG. 25, an object transporting apparatus is composed that is able to perform transport of object 17. In the case of performing this transport, as shown in FIG. 25, if two or more object transporting apparatuses are installed in a row so that their respective transport paths are continuous, the length of the transport path can be set as desired, thereby resulting in superior general applicability due to a large degree of freedom.

Figure 26:
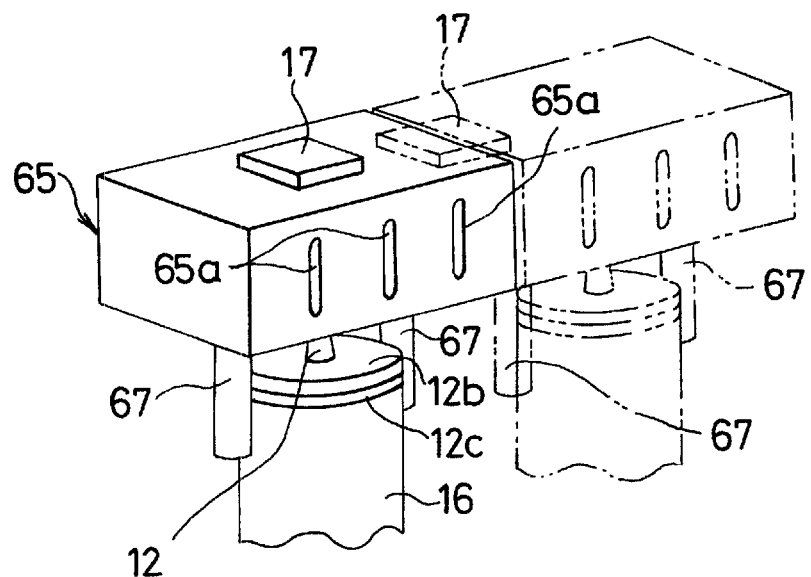
FIG. 26 is a perspective view of the essential portion of an object levitating apparatus as a twelfth embodiment of the present invention.

FIG. 26 indicates an object levitating apparatus as a twelfth embodiment of the present invention. Said object levitating apparatus is composed in the same manner as the object levitating apparatus of the above-mentioned eleventh embodiment with the exception of attaching additional vibrators 67, generically referred to as trap horns, in a suspended state on the lower surface in the vicinity of both ends of vibrator 65 equipped on the object levitating apparatus of said eleventh embodiment. Accordingly, in said object levitating apparatus as well, vibrator 65 vibrates longitudinally overall in the in-phase piston mode with horn 12, thereby levitating object 17 above the surface of vibrator 65.

As a result of attaching the above-mentioned additional vibrators 67, distribution of vibrational displacement can be realized in the flat vertical direction above the radiating surface of vibrator 65. Furthermore, this type of additional vibrator is disclosed on pages 9 through 16 and in other locations of "Vibration Mode Control of Large Ultrasonic Tools Using Wave Trapped Horns" (Journal of the Telecommunication and Information Society) published on Feb. 23, 1988.

Figure 27:
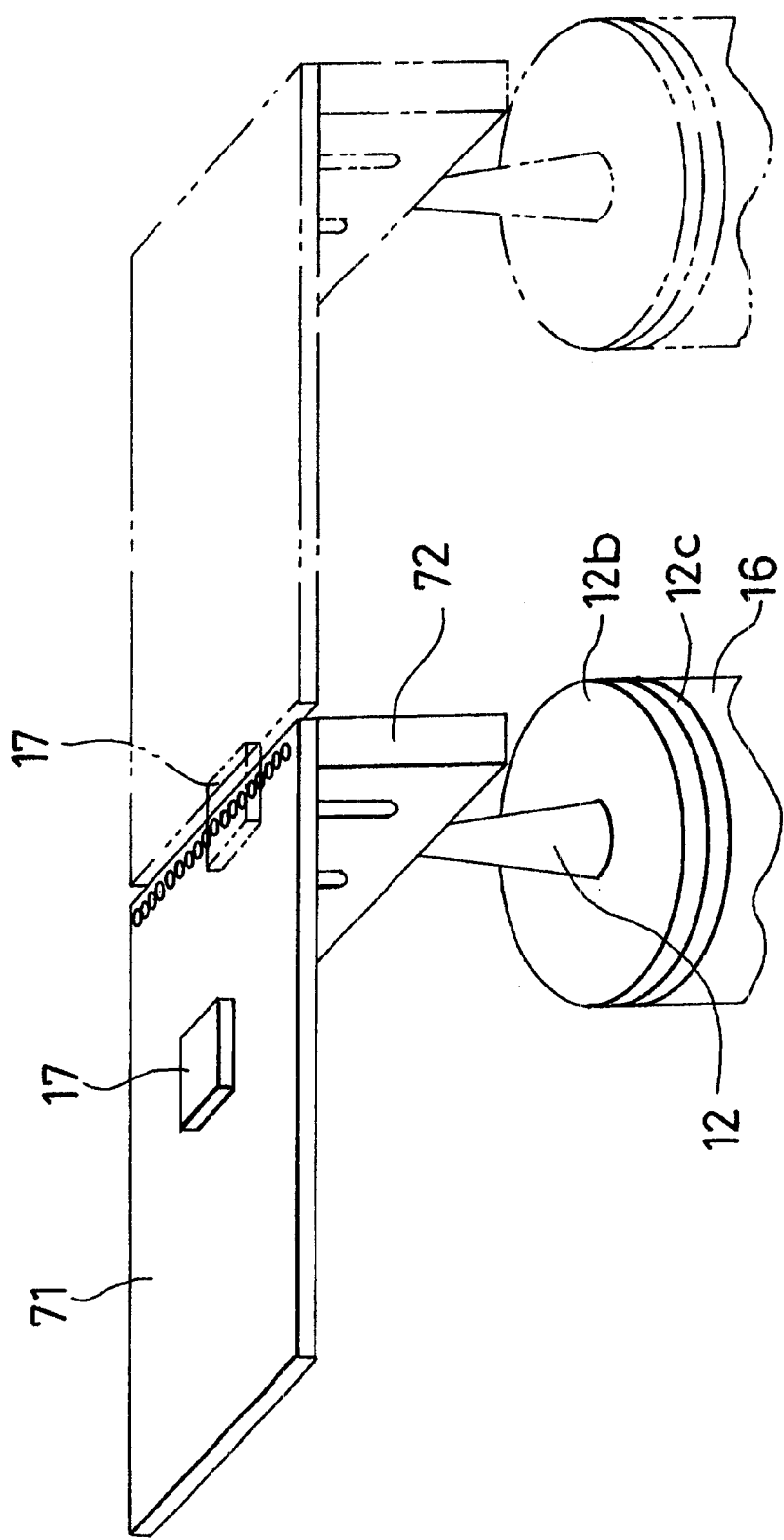
FIG. 27 is a perspective view of the essential portion of an object levitating apparatus as a thirteenth embodiment of the present invention.
Figure 28:
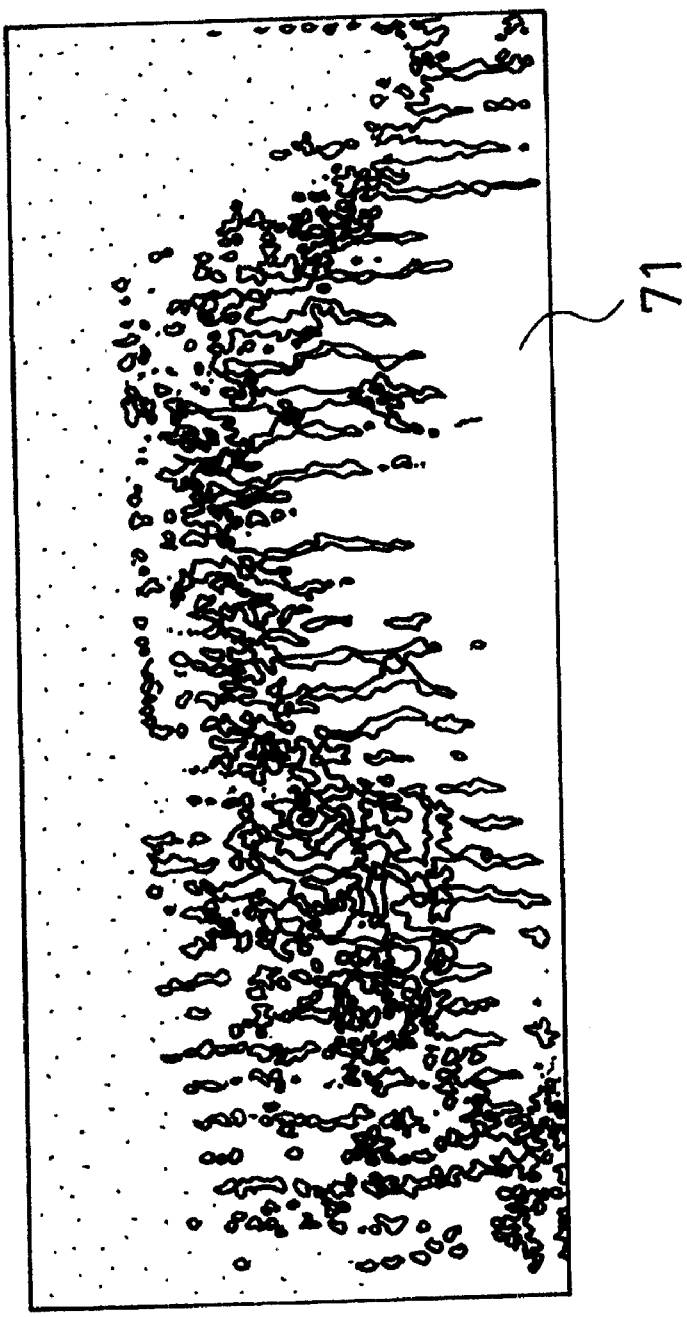
FIG. 28 is an overhead view of the vibrator equipped on the object levitating apparatus shown in FIG. 27.

Next, the following provides an explanation of an object levitating apparatus as a thirteenth embodiment of the present invention based on FIGS. 27 and 28.

As shown in the drawings, said object levitating apparatus is equipped with primary vibrator 71 for levitating object 17 above its surface, and auxiliary vibrator 72, which is juxtapositioned between said primary vibrator 71 and excitation horn 12. Primary vibrator 71 is made of Duralumin, and has a length L of 695 mm, breadth B of 220 mm, and thickness t of 3 mm. In addition, a plate-shaped horn is used for auxiliary vibrator 72 that was designed so that vibrations are uniformly distributed over the end surface by finite element analysis. Together with being fastened at its lower end to the end of the above-mentioned horn 12, it is also fastened to one side of the above-mentioned primary vibrator 71 using 18 M6 bolts with hexagon sockets.

In the object levitating apparatus of the constitution described above, primary vibrator 71 vibrates in a slit mode based on longitudinal vibrations transmitted through horn 12. When that vibration mode was measured by Chladni's sand figures, the results shown in FIG. 28 were obtained. According to this constitution as well, object 17 is levitated above the surface of primary vibrator 71.

By adding a traveling device like that shown in FIGS. 7 through 14 to the object levitating apparatus of the constitution shown in FIG. 27, an object transporting apparatus is composed that is able to perform transport of object 17. In the case of performing this transport, as shown in FIG. 27, if two or more object transporting apparatuses are installed in a row so that their respective transport paths are continuous, the length of the transport path can be set as desired, thereby resulting in excellent general applicability due to a large degree of freedom.

Experiments were conducted on the object levitating apparatuses of each of the embodiments described above to confirm the actual state of object levitation. More specifically, specific experiments were conducted to investigate the relationship between vibration amplitude and levitation distance, the mass of the levitated object and levitation distance and so forth while changing the vibration mode of the vibrator. The following provides an explanation of those experiments.

Figure 29:
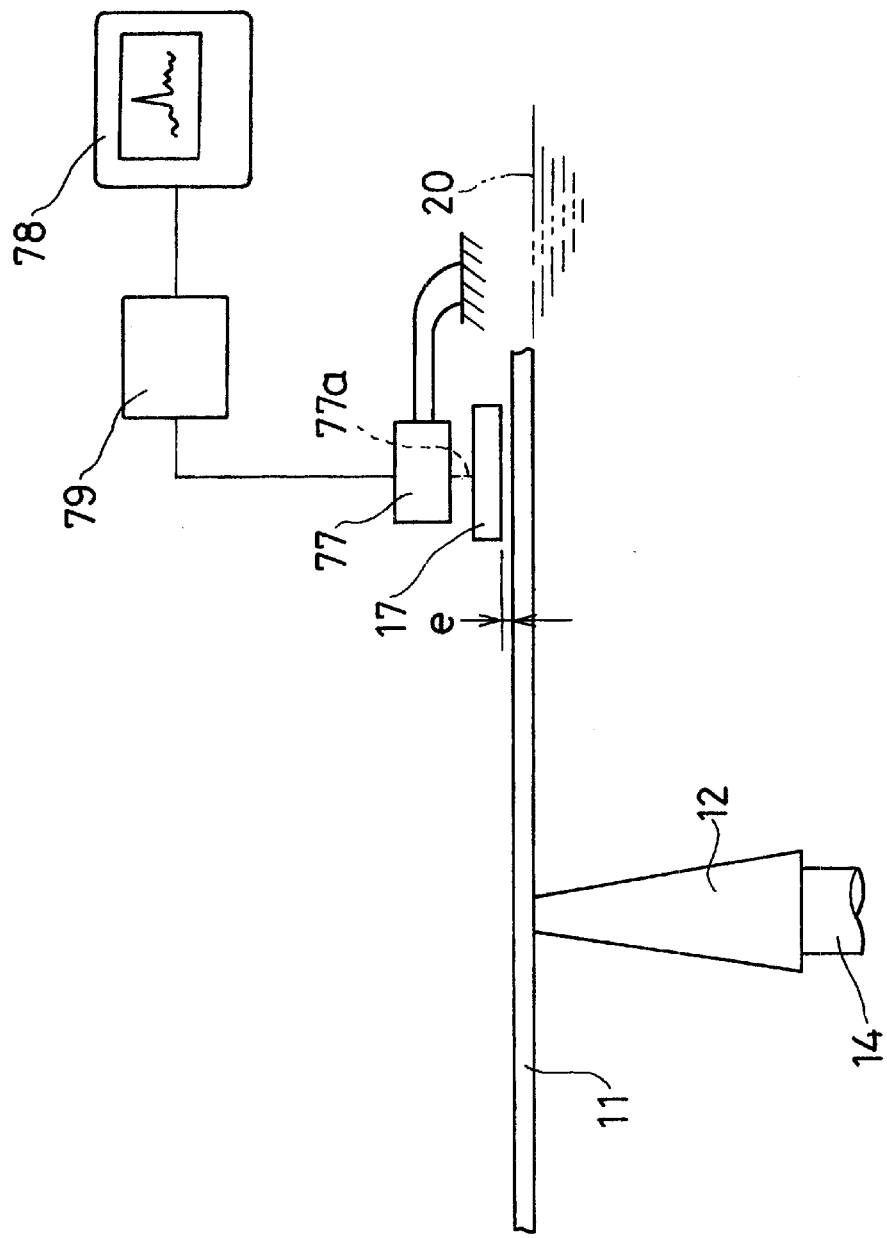
FIG. 29 is a front view showing the essential portion of the object levitating apparatus as claimed in the present invention, and the gist of a measuring apparatus that performs measurements relating to said apparatus.

The measurement system shown in FIG. 29 was made available for these experiments. This measurement system measures levitation distance e of each object 17 above each of the vibrators described above (for example, vibrator 11 is indicated which vibrates in the grating mode). As shown in the drawing, the measurement system has laser displacement gauge 77, oscilloscope 78 for displaying the measured values obtained from said laser displacement gauge 77, and displacement gauge 79 that amplifies the signals generated from said laser displacement gauge 77, and is juxtapositioned between both to display the signals on oscilloscope 78.

The above-mentioned laser displacement gauge 77 irradiates laser light 77a towards the upper surface of object 17 from directly above said object 17. It then measures distance by utilizing that reflected light. Various known measuring principles can be employed. Measurement is specially performed as described below.

To begin with, object 17 is placed on vibrator 11 while said vibrator 11 is not vibrating and at rest. While in this state, the above-mentioned measurement system is operated to determine the distance to the upper surface of object 17 while at rest. This value is used as the reference for levitation distance measurement, and the system is then reset using this value for 0 (zero). Next, vibrator 11 is vibrated and object 17 is levitated. While in this state, the measurement system is again operated and measurement is performed. Since the measured value obtained here is the distance from the above-mentioned reference, said measured value represents levitation distance e. Furthermore, when object 17 is made of metal, mutual continuity is obtained when a current is passed between object 17 and vibrator 11 when in the non-levitated state. Therefore, levitation of object 17 was confirmed by the achieving of a non-continuous state when continuity was interrupted as a result of levitation of object 17.

In this experiment, the various shapes of testpieces shown in FIGS. 30 and 31 were made available for use as levitated objects, and measurement of levitation distance was performed on these testpieces. Those testpieces that were levitated in this experiment consisted of three types, namely a silicon wafer, Bakelite plate and aluminum metal block. Since the testpieces were levitated by using the radiation pressure of sound waves, a flat surface was selected for the bottom surface of the testpieces.

FIG. 30 indicates the various types of testpieces used for a levitation experiment of the grating vibration mode. The testpieces selected were of a size that enabled them to be levitated with stability and horizontal with the grating vibration mode. In addition, the testpieces shown in FIG. 30 were also used for a levitation experiment of slit mode vibrations. In addition, each of the testpieces shown in FIG. 31 was used for a levitation experiment on the in-phase piston mode (longitudinal vibrations). In the case of this in-phase piston mode vibration, even small testpieces are levitated. In addition, although this will also be described later, since the diameter of the sound source is 60 mm, testpieces having dimensions smaller than that were selected.

On the other hand, the following apparatus was selected for the object levitating apparatus to levitate each of the above-mentioned testpieces.

To begin with, the object levitating apparatus indicated as the first embodiment in FIGS. 2 through 4 was selected for the levitation experiment of grating mode vibration. However, a rectangular plate made of Duralumin and having length L of 434 mm, breadth B of 178 mm and thickness t of 3 mm was used for vibrator 11 equipped on said object levitating apparatus. This vibrator 11 was coupled at its center to exponential horn 12 made of Duralumin with M6 bolts with hexagon sockets (not shown). Levitation properties were then measured by exciting the testpieces with the same vibrator at three types of resonance frequencies having different vibration modes. The resonance frequencies were as shown below.

f1=18.48 kHz f2=19.11 kHz f3=19.98 kHz

The input power was 27.5 W at a driving frequency f2 of 19.11 kHz and vibration amplitude at the bolt heads of 20 μmp-p.

Next, the object levitating apparatus shown as the thirteenth embodiment shown in FIGS. 27 and 28 was used for the levitation experiment of slit mode vibration. Furthermore, in this case, the dimensions, materials and so forth used for primary vibrator 71 and auxiliary vibrator 72 equipped on said object levitating apparatus were the same as indicated in the explanation of said object levitating apparatus. In addition, the input power of the oscillator at a resonance frequency of 19.04 kHz was 102 W when the vibration amplitude of the bolt heads was 20 μmp-p. As previously described, when the vibration mode was measured with Chladni's sand figures (see FIG. 28), the distance between nodes, namely half the wavelength, was roughly 19 mm.

The object levitating apparatus indicated as the eighth embodiment shown in FIGS. 20 and 21 was used in the levitation experiment of in-phase piston mode vibration (longitudinal vibration). Furthermore, the resonance frequency was 19.36 kHz.

Figure 32:
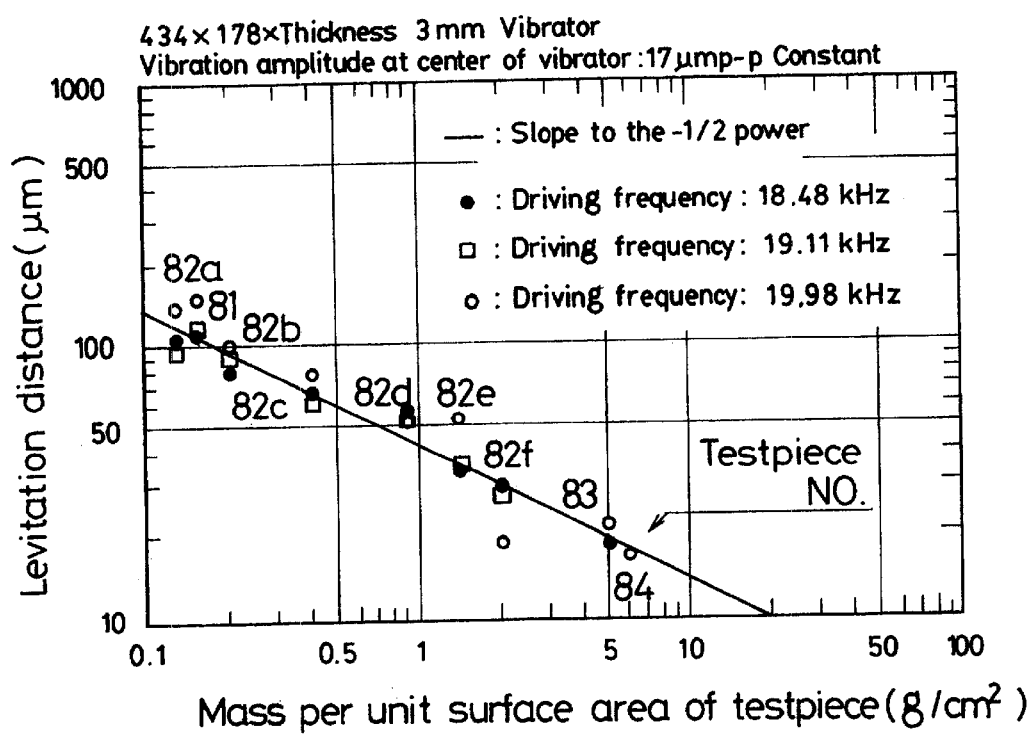
FIG. 32 is a graph showing a summary of the results of measured values obtained with the measuring apparatus shown in FIG. 29.
Figure 33:
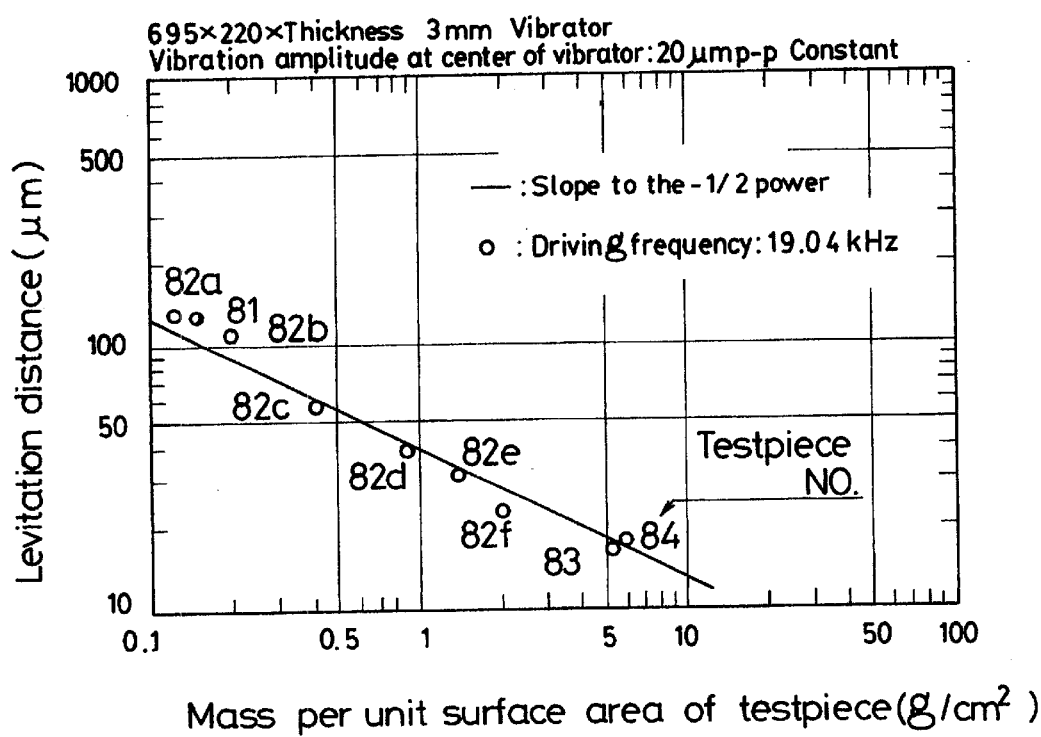
FIG. 33 is a graph showing a summary of the results of measured values obtained with the measuring apparatus shown in FIG. 29.
Figure 34:
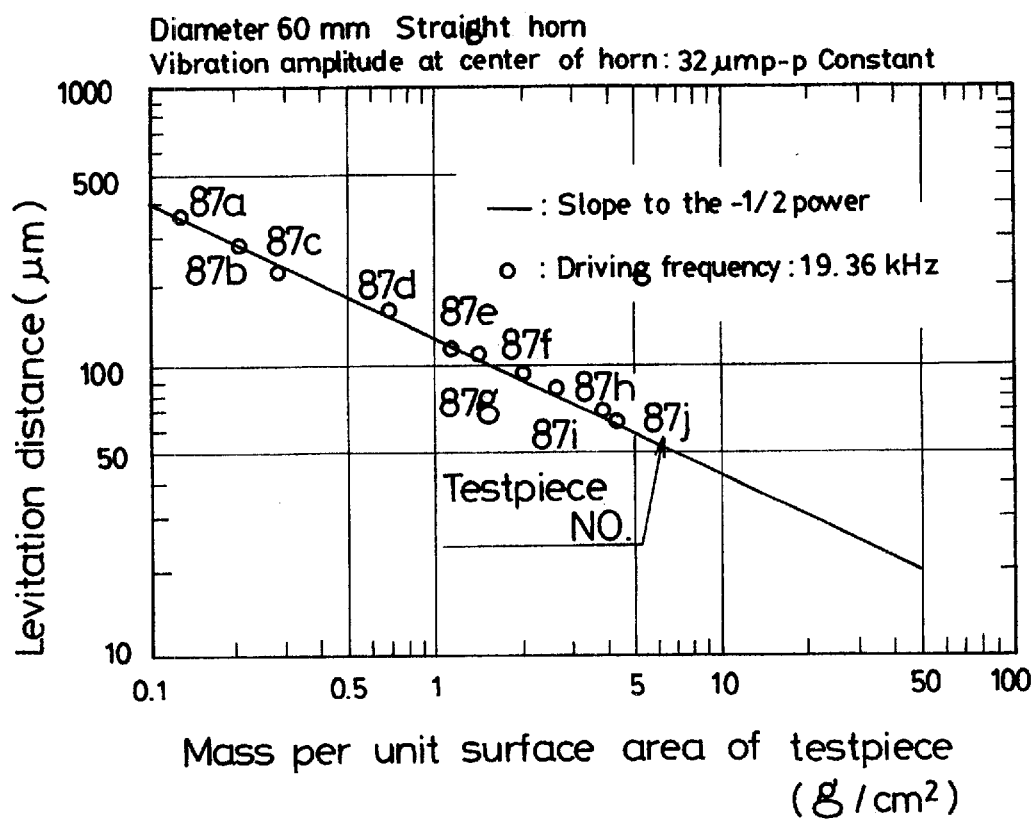
FIG. 34 is a graph showing a summary of the results of measured values obtained with the measuring apparatus shown in FIG. 29.

In the first experiment, each of the testpieces shown in FIGS. 30 and 31 were placed on each sound source, and the levitation distance of each testpiece at that time with respect to its mass was measured while maintaining vibration amplitude constant. Those results are shown in FIGS. 32 through 34. In said diagrams, mass on the horizontal axis was qualified with the surface area of the bottom surface of the testpiece, namely the surface area of the surface that directly receives the sound waves. Thus, mass is expressed as the mass per unit surface area, and the units are g/cm Based on the above results, although levitation distance varies with respect to vibration amplitude, the relationship between mass per unit surface area and levitation distance was confirmed to be proportional to the –½ power regardless of the type of vibration mode of the sound source. In addition, the levitation distance of the testpiece varies when the vibration mode of the sound source varies. This is considered to be due to the radiation pressure of the sound waves that are radiated changing depending on the location since vibration amplitude is distributed over the vibrator. Furthermore, since a generator controlled to a constant amplitude was used for the input power of the vibration system, input power varies slightly according to the mass of the testpiece. This is because when a testpiece of large mass is placed on the vibrator, the impedance viewed from the edge of the oscillator becomes large. Since a generator in which amplitude is controlled to a constant level is used, the output of the generator increases.

Next, in the second experiment, levitation distance was measured while changing vibration amplitude. Here, the locations at which vibration amplitude was measured for each vibration mode are as shown below.

(1) Grating Mode Vibration:
  Head of fastening bolt in center of vibrator
(2) Slit Mode Vibration:
  Head of connecting bolt of plate-shaped horn 72
(3) In-Phase Piston Vibration:
  Nearly in the center of the end surface of straight horn 55 having a diameter of 60 mm In the case of grating mode vibration, vibrator 11 (434× 178×3 mm thick, made of Duralumin) was used as previously described, and measurements were made while changing vibration amplitude at the three resonance points. As was previously described, each of the frequencies was set at f1, f2 and f3 starting with the lowest frequency, the following values being used for those frequencies. The respective vibration modes were different in each case.

f1=18.48 kHz f2=19.11 kHz f3=19.98 kHz

Figure 35:
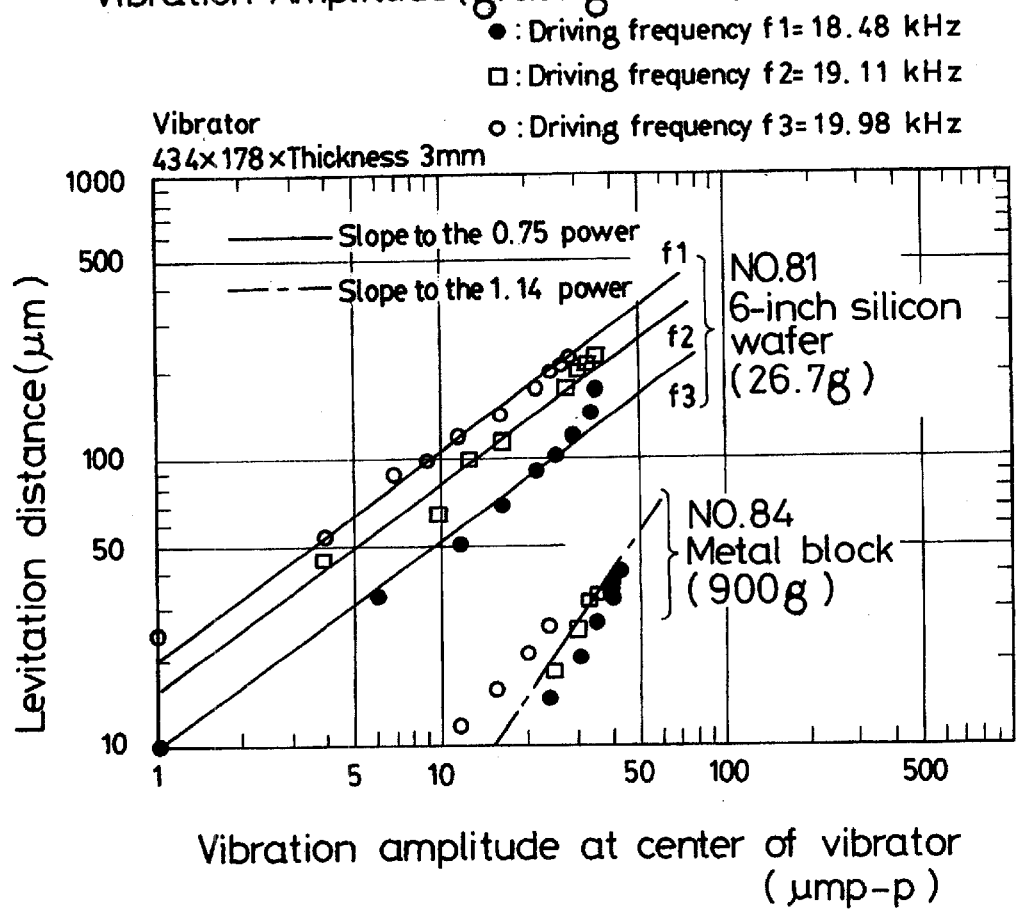
FIG. 35 is a graph showing a summary of the results of measured values obtained with the measuring apparatus shown in FIG. 29.

Those results are shown in FIG. 35.

Figure 36:
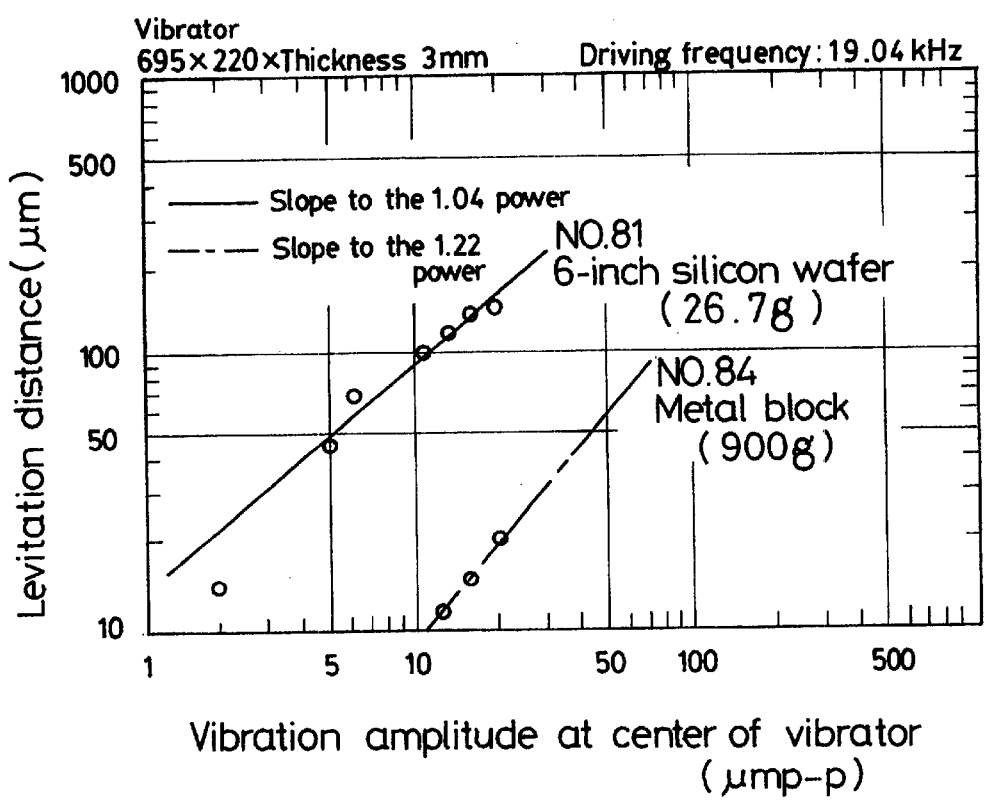
FIG. 36 is a graph showing a summary of the results of measured values obtained with the measuring apparatus shown in FIG. 29.

In addition, a slit mode vibrator made of Duralumin and measuring 695×220×3 mm thick was used for slit mode vibration, and measurements were made while changing vibration amplitude. The driving frequency was 19.04 kHz. Those results are shown in FIG. 36.

Figure 37:
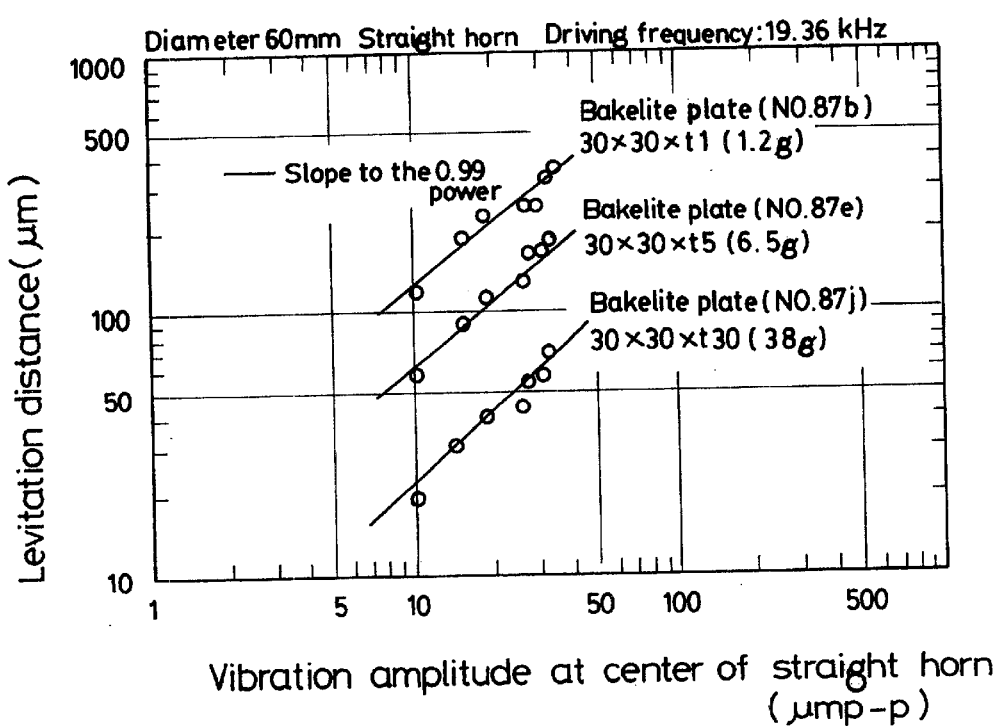
FIG. 37 is a graph showing a summary of the results of measured values obtained with the measuring apparatus shown in FIG. 29.

Similarly, a stainless steel straight horn having a diameter of 60 mm was used for in-phase piston vibration, and measurements were similarly made while changing vibration amplitude. Those results are shown in FIG. 37.

Based on the above results, in any of the vibration modes, levitation distance was confirmed to increase proportionally to vibration amplitude. However, the slope of that proportionality was verified to differ depending on the vibration mode.

In the case of grating mode vibration, slope ranged from roughly the 0.75 power to the 1.14 power, in the case of slit mode vibration from roughly the 1.04 power to the 1.22 power, and in the case of in-phase piston mode vibration, roughly the 0.99 power.

In addition, the slope of levitation distance was also verified to vary according to the mass of the testpiece. Based on the experimental results of a grating mode sound source as shown in FIG. 35, although the proportional slope was to a power of roughly 0.75 in the case of a 6-inch silicon wafer (26.7 g, testpiece no. 81), levitation distance was proportional to roughly the 1.14 power for an aluminum metal block (900 g, testpiece no. 84).

This is thought to be the result of the following causes:

(1) When sand is placed on a silicon wafer or thin Bakelite plate during levitation, a vibration pattern similar to that of the vibrator was confirmed. A sand figure pattern did not appear at all, however, in the case of a large, thick metal block (900 g). Based on these findings, it was found that reflection and transmission of sound waves occur in the case of thin testpieces. However, in the case of thick metal blocks, the amount of transmission can be considered to be extremely low, with sound waves being nearly completely reflected at the interface (bottom surface of the testpiece). It is therefore assumed that the slope of the proportionality of the relationship between levitation distance and amplitude varies accordingly.

(2) As the mass per unit surface area increases, the repulsive force received from the testpiece also increases. Since the vibrator then ended up statically deflecting, measurement error occurred. This measurement error is assumed to have caused a change in the slope of the proportion.

As has been described above, an experimental study was conducted on the relationship between vibration mode and levitation properties using different wavelengths of flexural oscillation, different sizes of testpieces or levitated substances, and sound sources having different vibration modes. The following became clear based on the results of those experiments.

1) In order to levitate the levitated substance with stability and in parallel with the vibrator, it is necessary that the size of the levitated substance be at least roughly ½ of the wavelength with respect to the length of the wavelength of flexural oscillation.
2) The relationship between levitation distance and mass per unit surface area of the levitated substance is nearly proportional to a power of −½ regardless of the vibration mode.
3) Although relationship between levitation distance and vibration amplitude is proportional, the slope of that proportion varies according to the vibration mode of the sound source.
4) The relationship between levitation distance and vibration amplitude is such that the slope of the proportional also varies according to the mass of the substance being levitated. Namely, the slope becomes larger the larger the mass of the levitated substance. As was previously described, this is assumed to be the result of the measured slope of the proportion varying due to transmission of sound waves and the vibrator being statically deflected by the repulsive force of radiation pressure.

Furthermore, the present invention is not limited to the constitutions of each of the embodiments described above, but rather a diverse range of constitutions can naturally be realized by mutually combining one portion of any two or more constitutions of each of those embodiments.

In addition, although Duralumin is used for the material of the vibrator in each of the embodiments described above, various other materials can also be employed, examples of which include carbon steel and its alloy stainless steel, and titanium alloys.

According to the present invention as explained above, the present invention offers the advantage of being able to levitate and transport all types of objects, regardless of whether or not they are magnetic, without any restrictions on the material and so forth of the object used, and including objects that cannot be placed in a magnetic field, and is able to accommodate objects having relatively large weight and dimensions.

In addition, since the apparatus is only required to be minimally provided with essentially a vibrator and an ultrasonic excitation device that excites said vibrator, together with offering the advantage of achieving compact size and reduced cost, it also contributes to conservation of energy since electrical power consumption is extremely low.

Moreover, since levitating action is the result of radiation pressure of sound waves converted from electrical energy, together with being able to easily ensure the safety of the operator, it also offers the advantage of being able to be easily controlled by supplying and interrupting its power.

Since the shape of the vibrator can be suitably changed according to the application, and a plurality of apparatuses should simply be arranged in a row to transport an object over a long distance, the present invention has an extremely large degree of freedom as well as excellent general applicability.

In particular, since there are no vibration nodes present as a result of in-phase piston mode vibration, the dimensions of the object to be levitated and transported can be small.

What is claimed is:

1. An object levitating apparatus, comprising: means for vibrating uniformly in-phase and having upper and lower surfaces, and an ultrasonic excitation device that is attached to the lower surface of the means for vibrating, said ultrasonic excitation device exciting the means for vibrating such that the means for vibrating vibrates longitudinally, roughly perpendicular to the upper surface, so that sound waves are generated and a radiated pressure is generated by said sound waves emitted from said means for vibrating for levitating an object without the use of a reflector above said object.

2. An object transporting system, comprising:
   means for vibrating uniformly in-phase and having upper and lower surfaces;
   an ultrasonic excitation device that is attached to the lower surface of said means for vibrating, said ultrasonic excitation device exciting said means for vibrating such that the means for vibrating vibrates longitudinally roughly perpendicular to the upper surface so that a radiated pressure generated by sound waves emitted from the said means for vibrating levitates an object without the use of a reflector above said object, said object having first and second sides and a bottom surface; and
   a traveling device positioned about said means for vibrating, said traveling device causing the object, when levitating, to move parallel to the upper surface of said means for vibrating.

3. An object transporting system comprising:
   means for vibrating uniformly in-phase and having upper and lower surfaces;
   an ultrasonic excitation device that is attached to the lower surface of said means for vibrating, said ultrasonic excitation device exciting said means for vibrating such that the means for vibrating vibrates longitudinally roughly perpendicular to the upper surface so that a radiated pressure generated by sound waves emitted from the said means for vibrating levitates an object, said object having first and second sides and a bottom surface; and
   a traveling device positioned about said means for vibrating;
   wherein said traveling device comprises an air blowing device that blows air onto said object, when levitating, causing the object to move parallel to the upper surface of said means for vibrating.

4. An object transporting system as set forth in claim 2, wherein said traveling device comprises an ultrasonic radiation device that radiates ultrasonic waves onto said object causing the object, when levitating, to move parallel to the upper surface of said means for vibrating.

5. An object transporting system as set forth in claim 2, wherein said traveling device comprises reflecting members that reflect ultrasonic waves radiated from said vibrator towards said object causing said object, when levitating, to move parallel to the upper surface of said means for vibrating.

6. An object transporting system, comprising:
   means for vibrating uniformly in-phase and having upper and lower surfaces;
   an ultrasonic excitation device that is attached to the lower surface of said means for vibrating, said ultrasonic excitation device exciting said means for vibrating such that the means for vibrating vibrates longitudinally roughly perpendicular to the upper surface so that a radiated pressure generated by sound waves emitted from the said means for vibrating levitates an object, said object having first and second sides and a bottom surface; and a traveling device positioned about said means for vibrating, said traveling device causing the object to move above the upper surface of said means for vibrating;

wherein said traveling device comprises an energy conversion device connected to the lower surface of said vibrator which converts ultrasonic energy produced by the ultrasonic device into electrical energy that is used by the energy conversion device to generate progressive sound waves, said progressive sound waves causing the object to move in a direction above the upper surface of said means for vibrating.

7. An object transporting system as set forth in claim 2, wherein a weight distribution of said object differs between the first side of the object, which is forward in the direction of travel of said object, and the second side of the object, which is rearward in the said direction of travel, and wherein said object, when levitating, is caused to travel parallel to the upper surface of said means for vibrating by means of propulsion resulting from sound waves that are radiated from said means for vibrating and reflected by the lower surface of said object.

8. An object transporting system as set forth in claim 2, wherein at least one tooth-like projection is formed in the bottom surface of said object, and wherein said object, when levitating, is caused to travel parallel to the upper surface of said means for vibrating by means of propulsion resulting from sound waves radiated from said means for vibrating and reflected by a surface of said tooth-like projection.

9. An object transporting system as set forth in claim 2, further comprising a plurality of apparatuses which are arranged in a row so that an object transport path is created which continuous.

10. An object levitating apparatus, comprising:

means for vibrating uniformly in-phase; and an ultrasonic excitation device for exciting said means for vibrating uniformly in-phase;

wherein said ultrasonic excitation device excites said means for vibrating uniformly inphase so that longitudinal vibrations are produced in said means for vibrating uniformly inphase, said longitudinal vibrations being roughly perpendicular to an upper surface of said means for vibrating uniformly in-phase; and wherein an object is levitated above said upper surface by the radiation pressure of sound waves of said means for vibrating uniformly in-phase, said object being levitated without the use of a reflector above said object and maintained in a balanced position which is parallel to said upper surface of said means for vibrating uniformly in-phase.

11. An object levitating apparatus, comprising:

a straight horn having upper and lower surfaces, and an ultrasonic excitation device comprising a conical horn which is attached to the lower surface of the straight horn, said ultrasonic excitation device exciting the straight horn such that the straight horn vibrates longitudinally, roughly perpendicular to the upper surface, so that sound waves are generated and a radiated pressure is generated by said sound waves emitted from the straight horn for levitating an object.

12. The object levitating apparatus defined by claim 11, wherein said object is levitated above the upper surface of said straight horn at a height which is less than one-tenth of the wave-length of said sound waves.

* * * * *